United States Patent
Senda

(10) Patent No.: US 8,325,118 B2
(45) Date of Patent: Dec. 4, 2012

(54) ELECTRIC CURRENT DRIVING TYPE DISPLAY DEVICE

(75) Inventor: Takahiro Senda, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 939 days.

(21) Appl. No.: 12/281,746

(22) PCT Filed: Dec. 18, 2006

(86) PCT No.: PCT/JP2006/325186
§ 371 (c)(1),
(2), (4) Date: Sep. 4, 2008

(87) PCT Pub. No.: WO2007/138729
PCT Pub. Date: Dec. 6, 2007

(65) Prior Publication Data
US 2009/0040150 A1    Feb. 12, 2009

(30) Foreign Application Priority Data

May 30, 2006    (JP) .............................. P2006-149142

(51) Int. Cl.
*G09G 3/36*    (2006.01)
(52) U.S. Cl. ............... 345/82; 345/36; 345/39; 345/44; 345/74.1; 345/76; 315/169.3; 313/463
(58) Field of Classification Search ............. 345/36, 345/39, 44–46, 74.1–83; 315/169.3; 313/463
See application file for complete search history.

(56) References Cited

U.S. PATENT DOCUMENTS

| 2004/0080474 A1* | 4/2004 | Kimura ......................... 345/82 |
| 2005/0110730 A1 | 5/2005 | Kim et al. |
| 2005/0140600 A1 | 6/2005 | Kim et al. |
| 2005/0200300 A1 | 9/2005 | Yumoto |
| 2005/0206590 A1 | 9/2005 | Sasaki et al. |
| 2005/0243036 A1 | 11/2005 | Ikeda |
| 2006/0082566 A1 | 4/2006 | Akimoto et al. |
| 2007/0103406 A1 | 5/2007 | Kim |

FOREIGN PATENT DOCUMENTS

| JP | 2003-223138 A | 8/2003 |
| JP | 2003-271095 A | 9/2003 |
| JP | 2005-157244 A | 6/2005 |

(Continued)

*Primary Examiner* — Kevin M Nguyen
*Assistant Examiner* — Cory Almeida
(74) *Attorney, Agent, or Firm* — Birch, Stewart, Kolasch & Birch, LLP

(57) ABSTRACT

In a pixel circuit 100, a driving TFT 110, a switching TFT 115, and an organic EL element 130 are provided between a power supply wiring line Vp and a common cathode Vcom and a capacitor 120 and a switching TFT 111 are provided between a gate terminal of the driving TFT 110 and a data line Sj. A switching TFT 112 is provided between a connection point B between the capacitor 120 and the switching TFT 111 and the power supply wiring line Vp, a switching TFT 113 is provided between the gate and drain terminals of the driving TFT 110, and a switching TFT 114 is provided between the gate terminal of the driving TFT 110 and a reference supply wiring line Vs. A potential that brings the driving TFT 110 into a conduction state is applied to the reference supply wiring line Vs. Thus, variations in the threshold voltage of a drive element can be properly compensated for and unwanted light emission from an electro-optical element can be prevented.

11 Claims, 12 Drawing Sheets

FOREIGN PATENT DOCUMENTS

| | | |
|---|---|---|
| JP | 2005-157308 A | 6/2005 |
| JP | 2005-165178 A | 6/2005 |
| JP | 2005-326828 A | 11/2005 |
| JP | 2006-78911 A | 3/2006 |
| JP | 2006-119242 A | 5/2006 |
| JP | 2007-133369 A | 5/2007 |
| WO | WO-98/48403 A1 | 10/1998 |
| WO | WO-01/06484 A1 | 1/2001 |

* cited by examiner

ELECTRIC CURRENT DRIVING TYPE DISPLAY DEVICE

TECHNICAL FIELD

The present invention relates to a display device and more particularly to an electric current driving type display device such as an organic EL display or FED.

BACKGROUND ART

In recent years, there have been demands for thin, lightweight, fast response display devices, and accordingly, research and development for organic EL (Electro Luminescence) displays and FEDs (Field Emission Displays) have been actively conducted.

An organic EL element included in an organic EL display emits light with higher luminance as the voltage to be applied thereto is higher and the amount of current flowing therethrough is larger. However, the relationship between luminance and voltage of the organic EL element easily varies due to an influence such as drive time or ambient temperature. Hence, when a voltage control type drive scheme is adopted in an organic EL display, it is very difficult to suppress variations in the luminance of the organic EL element. In contrast to this, the luminance of the organic EL element is substantially proportional to current and this proportional relationship is less susceptible to external factors such as ambient temperature. Therefore, it is desirable to adopt an electric current control type drive scheme in the organic EL display.

Meanwhile, a pixel circuit and a drive circuit of a display device are composed using TFTs (Thin Film Transistors) made of amorphous silicon, low-temperature polycrystal silicon, CG (Continuous Grain) silicon, or the like. However, variations easily occur in TFT characteristics (e.g., threshold voltage and mobility). In view of this, a circuit that compensates for variations in TFT characteristics is provided in a pixel circuit of an organic EL display and by the action of this circuit, variations in the luminance of the organic EL element are suppressed.

Schemes to compensate for variations in TFT characteristics in an electric current driving type drive scheme are broadly divided into an electric current program scheme in which the amount of current flowing through a driving TFT is controlled by a current signal; and a voltage program scheme in which such an amount of current is controlled by a voltage signal. Use of the electric current program scheme enables to compensate for variations in threshold voltage and mobility and use of the voltage program scheme enables to compensate for only variations in threshold voltage.

However, the electric current program scheme has the following problems: first, since a very small amount of current is handled, it is difficult to design a pixel circuit and a drive circuit; and second, since it is susceptible to parasitic capacitance while a current signal is set, it is difficult to achieve a large-area circuit. On the other hand, in the voltage program scheme, an influence of parasitic capacitance, etc., is little and a circuit design is also relatively simple. In addition, the influence exerted on the amount of current by variations in mobility is smaller than the influence exerted on the amount of current by variations in threshold voltage and the variations in mobility can be suppressed to a certain extent in a TFT fabrication process. Accordingly, even a display device adopting the voltage program scheme can obtain satisfactory display quality.

For an organic EL display adopting the electric current driving type drive scheme, a pixel circuit shown below has been conventionally known. FIG. 17 is a circuit diagram of a pixel circuit described in Patent Document 1. A pixel circuit 910 shown in FIG. 17 includes a driving TFT 911, switching TFTs 912 to 914, capacitors 915 and 916, and an organic EL element 917, All of the TFTs included in the pixel circuit 910 are of a p-channel type.

In the pixel circuit 910, the driving TFT 911, the switching TFT 914, and the organic EL element 917 are provided in series between a power supply wiring line Vp (potential is VDD) and a ground. The capacitor 915 and the switching TFT 912 are provided in series between a gate terminal of the driving TFT 911 and a data line Sj. The switching TFT 913 is provided between the gate and drain terminals of the driving TFT 911 and the capacitor 916 is provided between the gate terminal of the driving TFT 911 and the power supply wiring line Vp. A gate terminal of the switching TFT 912 is connected to a scanning line Gi, a gate terminal of the switching TFT 913 is connected to an auto-zero line AZi, and a gate terminal of the switching TFT 914 is connected to an illumination line ILi.

FIG. 18 is a timing chart of the pixel circuit 910. Before time t0, the potentials of the scanning line Gi and the auto-zero line AZi are controlled to a high level, the potential of the illumination line ILi is controlled to a low level, and the potential of the data line Sj is controlled to a reference potential Vstd. When at time t0 the potential of the scanning line Gi is changed to a low level, the switching TFT 912 is changed to a conduction state. Then, when at time t1 the potential of the auto-zero line AZi is changed to a low level, the switching TFT 913 is changed to a conduction state. Thus, the gate and drain terminals of the driving TFT 911 are equal in potential.

Then, when at time t2 the potential of the illumination line ILi is changed to a high level, the switching TFT 914 is changed to a non-conduction state. At this time, a current flows into the gate terminal of the driving TFT 911 from the power supply wiring line Vp through the driving TFT 911 and the switching TFT 913, and the gate terminal potential of the driving TFT 911 rises while the driving TFT 911 is in a conduction state. The driving TFT 911 is changed to a non-conduction state when the gate-source voltage becomes a threshold voltage Vth (negative value) (i.e., the gate terminal potential becomes (VDD+Vth)). Therefore, the gate terminal potential of the driving TFT 911 rises to (VDD+Vth).

Then, when at time t3 the potential of the auto-zero line AZi is changed to a high level, the switching TFT 913 is changed to a non conduction state. At this time, a potential difference (VDD+Vth−Vstd) between the gate terminal of the driving TFT 911 and the data line Sj is held in the capacitor 915.

Then, when at time t4 the potential of the data line Sj is changed from the reference potential Vstd to a data potential Vdata, the gate terminal potential of the driving TFT 911 is changed by the same amount (Vdata−Vstd) and thus becomes (VDD+Vth+Vdata−Vstd). Then, when at time t5 the potential of the scanning line Gi is changed to a high level, the switching TFT 912 is changed to a non-conduction state. At this time, a gate-source voltage (Vth+Vdata−Vstd) of the driving TFT 911 is held in the capacitor 916.

Then, when at time t6 the potential of the illumination line ILi is changed to a low level, the switching TFT 914 is changed to a conduction state. Thus, a current flows through the organic EL element 917 from the power supply wiring line Vp through the driving TFT 911 and the switching TFT 914. Although the amount of current flowing through the driving TFT 911 increases or decreases depending on the gate terminal potential (VDD+Vth+Vdata−Vstd), even when the threshold voltage Vth is different, if the potential difference (Vdata−Vstd) is the same, then the amount of current is the same. Therefore, regardless of the value of the threshold voltage Vth, a current of an amount according to the potential Vdata flows through the organic EL element 917 and thus the organic EL element 917 emits light with a luminance according to the data potential Vdata.

As such, according to the pixel circuit 910, variations in the threshold voltage of the driving TFT 911 can be compensated for and the organic EL element 917 is allowed to emit light with a desired luminance.

FIG. 19 is a circuit diagram of a pixel circuit described in Patent Document 2. A pixel circuit 920 shown in FIG. 19 includes a driving TFT 921, switching TFTs 922 to 925, a capacitor 926, and an organic EL element 927. The switching TFTs 923 and 925 are of an n-channel type and other TFTs are of a p-channel type.

In the pixel circuit 920, the driving TFT 921, the switching TFT 925, and the organic EL element 927 are provided in series between a power supply wiring line Vp and a common cathode Vcom (potentials are respectively VDD and VSS). The capacitor 926 and the switching TFT 922 are provided in series between a gate terminal of the driving TFT 921 and a data line Sj. Hereinafter, a connection point between the driving TFT 921 and the capacitor 926 is referred to as A and a connection point between the capacitor 926 and the switching TFT 922 is referred to as B. The switching TFT 923 is provided between the connection point B and the power supply wiring line Vp and the switching TFT 924 is provided between the connection point A and a drain terminal of the driving TFT 921. All gate terminals of the respective switching TFTs 922 to 925 are connected to a scanning line Gi.

FIG. 20 is a timing chart of the pixel circuit 920. Before time t0, the potential of the scanning line Gi is controlled to a high level. When at time t0 the potential of the scanning line Gi is changed to a low level, the switching TFTs 922 and 924 are changed to a conduction state and the switching TFTs 923 and 925 are changed to a non-conduction state. Thus, the connection point B is disconnected from the power supply wiring line Vp and connected to the data line Sj through the switching TFT 922. Also, the gate and drain terminals of the driving TFT 921 obtain the same potential. Hence, a current flows into the gate terminal of the driving TFT 921 from the power supply wiring line Vp through the driving TFT 921 and the switching TFT 924, and the potential at the connection point A rises while the driving TFT 921 is in a conduction state. The driving TFT 921 is changed to a non-conduction state when the gate-source voltage becomes a threshold voltage Vth (negative value) (i.e., the potential at the connection point A becomes (VDD+Vth)). Therefore, the potential at the connection point A rises to (VDD+Vth).

Then, when at time t1 the potential of the data line Sj is changed from a data potential Vdata0 for the last time (a data potential written to a pixel circuit in an adjacent upper row) to a data potential Vdata for this time, the potential at the connection point B is changed to Vdata. Accordingly, the voltage between electrodes of the capacitor 926 immediately before time t2 is a potential difference (VDD+Vth−Vdata) between the connection point A and the connection point B.

Then, when at time t2 the potential of the scanning line Gi is changed to a high level, the switching TFTs 922 and 924 are changed to a non-conduction state and the switching TFTs 923 and 925 are changed to a conduction state. Thus, the gate terminal of the driving TFT 921 is disconnected from the drain terminal. Also, the connection point B is disconnected from the data line Sj and connected to the power supply wiring line Vp through the switching TFT 923. Thus, the potential at the connection point B is changed from Vdata to VDD and accordingly the potential at the connection point A is changed by the same amount (VDD−Vdata; hereinafter, referred to as VB) and thus becomes (VDD+Vth+VB).

After time t2, the switching TFT 925 goes into a conduction state and thus a current flows through the organic EL element 927 from the power supply wiring line Vp through the driving TFT 921 and the switching TFT 925. Although the amount of current flowing through the driving TFT 921 increases or decreases depending on the gate terminal potential (VDD+Vth+VB), even when the threshold voltage Vth is different, if the potential difference VB is the same, then the amount of current is the same. Therefore, regardless of the value of the threshold voltage Vth, a current of an amount according to the potential Vdata flows through the organic EL element 927 and thus the organic EL element 927 emits light with a luminance according to the data potential Vdata.

As such, according to the pixel circuit 920, as with the pixel circuit 910, variations in the threshold voltage of the driving TFT 921 can be compensated for and the organic EL element 927 is allowed to emit light with a desired luminance. In addition, the pixel circuit 920 has an advantage over the pixel circuit 910 in that the circuit size is smaller due to the absence of the capacitor 916, the auto-zero line AZi, and the illumination line ILi. Note that in the pixel circuit 920 in order to bring the driving TFT 921 of a p-channel type into a conduction state, the potential difference VB needs to be negative (i.e., Vdata>VDD).

[Patent Document 1] International Publication Pamphlet No. WO 98/48403

[Patent Document 2] Japanese Patent Application Laid-Open No. 2005-157308

DISCLOSURE OF THE INVENTION

Problems to be Solved by the Invention

However, the pixel circuit 920 has a problem that it may not be able to properly compensate for variations in the threshold voltage of the driving TFT 921. For example, when almost no current flows through the driving TFT 921 in a previous frame (when black display is performed), the potential VA at the connection point A at time t0 in FIG. 20 is substantially (VDD+Vth). When the potential at the connection point B is changed from VDD to Vdata during the period from time t0 to time t1, accordingly, the potential at the connection point A is also changed. However, since, as described above, Vdata>VDD, if the potential at the connection point B rises from VDD to Vdata when the potential at the connection point A is substantially (VDD+Vth), then the potential at the connection point A becomes higher than (VDD+Vth). Due to this, the driving TFT 921 is controlled from a state in which almost no current is flown to a state in which further less current is flown, and thus, does not go into a conduction state. In this case, variations in the threshold voltage of the driving TFT 921 cannot be compensated for by the above-described method.

Patent Document 2 also describes a pixel circuit 930 shown in FIG. 21, in addition to the pixel circuit 920. In the pixel circuit 930, gate terminals of respective switching TFTs 922 and 924 are connected to a scanning line Gi and gate terminals of respective switching TFTs 923 and 925 are connected to a control line Ei. According to the pixel circuit 930, by changing the switching TFT 924 to a conduction state and thereafter changing the switching TFT 925 to a non-conduction state, the gate terminal potential of a driving TFT 921 can be drawn to a potential VSS of a common cathode Vcom. At this time, since the driving TFT 921 goes into a conduction state, variations in the threshold voltage of the driving TFT 921 can be compensated for by the above-described method. Note that Patent Document 2 describes the configuration of the pixel circuit 930 but does not clearly indicate that the pixel circuit 930 is operated at the above-described timing.

However, if the pixel circuit 930 is operated at the above-described timing, when the gate terminal potential of the driving TFT 921 is drawn to the potential VSS of the common cathode Vcom, a current flows through an organic EL element 927 and thus the organic EL element 927 emits light. Since the gate terminal potential of the driving TFT 921 at this time cannot be precisely controlled externally, even if the pixel circuit 930 is externally controlled, unwanted light emission from the organic EL element 927 cannot be suppressed. Hence, when the pixel circuit 930 is operated at the above-described timing, it is difficult to perform precise grayscale display. When black display is performed, too, the organic EL element 927 emits light and thus the contrast of a display screen decreases.

In the pixel circuit 920, while the potential of the scanning line Gi is at a low level (during one horizontal scanning period), a process of compensating for variations in the threshold voltage of the driving TFT is completed. Therefore, the gate terminal potential of the driving TFT 921 (potential at the connection point A) needs to be changed from a previous potential to a potential (VDD+Vth) for a threshold state during one horizontal scanning period.

However, the potential VA at the connection point A at time t0 in FIG. 20 varies depending on a data potential written to the pixel circuit 920 last time. The potential at the connection point A is, for example, furthest from (VDD+Vth) when the organic EL element 927 emits light at the maximum luminance before time t0 and closest to (VDD+Vth) when the organic EL element 927 does not emit light before time t0. However, in either case, the potential at the connection point A needs to be changed to (VDD+Vth) during one horizontal scanning period. Hence, in a high definition display device in which one horizontal scanning period is short, it is difficult to precisely compensate for variations in the threshold voltage of a driving TFT.

An object of the present invention is therefore to provide a display device that properly compensates for variations in the threshold voltage of a drive element and prevents unwanted light emission from an electro-optical element.

Means for Solving the Problems

A first aspect of the present invention is an electric current driving type display device including:
a plurality of pixel circuits arranged so as to correspond to respective intersections of a plurality of scanning lines and a plurality of data lines;
a scanning signal output circuit that selects a write-target pixel circuit using the scanning line; and
a display signal output circuit that provides potentials according to display data to the data lines, wherein
each of the pixel circuits includes:
an electro-optical element provided between a first power supply wiring line and a second power supply wiring line;
a drive element provided in series with the electro-optical element and between the first power supply wiring line and the second power supply wiring line;
a capacitor having a first electrode connected to a control terminal of the drive element;
a first switching element provided between a second electrode of the capacitor and the data line;

a second switching element provided between the second electrode of the capacitor and a predetermined power supply wiring line;
a third switching element provided between the control terminal and one current input/output terminal of the drive element; and
a fourth switching element having one terminal connected to a third power supply wiring line and having an other terminal connected directly or through the third switching element to the control terminal of the drive element.

A second aspect of the present invention is the display device according to the first aspect of the present invention, wherein
a potential that brings the drive element into a conduction state is applied to the third power supply wiring line.

A third aspect of the present invention is the display device according to the first aspect of the present invention, wherein
the fourth switching element is provided between the third power supply wiring line and the control terminal of the drive element.

A fourth aspect of the present invention is the display device according to the third aspect of the present invention, wherein
when writing to the pixel circuit,
during a first period, the first and fourth switching elements are controlled to a conduction state and the second and third switching elements are controlled to a non-conduction state,
then, during a second period, the fourth switching element is controlled to a non-conduction state and the third switching element is controlled to a conduction state, and
then, during a third period, the first and third switching elements are controlled to a non-conduction state and the second switching element is controlled to a conduction state.

A fifth aspect of the present invention is the display device according to the first aspect of the present invention, wherein the fourth switching element is provided between the third power supply wiring line and the current input/output terminal of the drive element, the terminal being connected to the third switching element.

A sixth aspect of the present invention is the display device according to the fifth aspect of the present invention, wherein
when writing to the pixel circuit,
during a first period, the first, third, and fourth switching elements are controlled to a conduction state and the second switching element is controlled to a non-conduction state,
then, during a second period, the fourth switching element is controlled to a non-conduction state, and
then, during a third period, the first and third switching elements are controlled to a non-conduction state and the second switching element is controlled to a conduction state.

A seventh aspect of the present invention is the display device according to the first aspect of the present invention, wherein the second switching element is provided between the first power supply wiring line and the second electrode of the capacitor.

An eighth aspect of the present invention is the display device according to the seventh aspect of the present invention, wherein
a control terminal of the fourth switching element is connected to the third power supply wiring line, and
a potential of the third power supply wiring line is switched between a potential that brings the drive element into a conduction state and a potential that brings the fourth switching element into a non-conduction state.

A ninth aspect of the present invention is the display device according to the first aspect of the present invention, wherein the second switching element is provided between the third power supply wiring line and the second electrode of the capacitor.

A tenth aspect of the present invention is the display device according to the ninth aspect of the present invention, wherein a potential of the third power supply wiring line is configured to be controllable.

An eleventh aspect of the preset invention is the display device according to the first aspect of the present invention, wherein each of the pixel circuits further includes a fifth switching element provided between the drive element and the electro-optical element.

A twelfth aspect of the present invention is the display device according to the first aspect of the present invention, wherein when writing to the pixel circuit, a potential of the second power supply wiring line is controlled such that an applied voltage to the electro-optical element is lower than a light-emission threshold voltage.

A thirteenth aspect of the present invention is the display device according to the first aspect of the present invention, wherein the electro-optical element includes an organic EL element.

A fourteenth aspect of the present invention is the display device according to the first aspect of the present invention, wherein the drive element and all of the switching elements in the pixel circuit include thin-film transistors.

A fifteenth aspect of the present invention is the display device according to the fourteenth aspect of the present invention, wherein the drive element and all of the switching elements in the pixel circuit include thin-film transistors of a same channel type.

EFFECT OF THE INVENTION

According to the first or second aspect of the present invention, by applying a potential that brings the drive element into a conduction state to the third power supply wiring line and controlling the fourth switching element (or the third and fourth switching elements) to a conduction state, a potential of the third power supply wiring line is provided to the control terminal of the drive element and regardless of a previous state of the pixel circuit, the drive element can be surely set to a conduction state. Thus, when the third switching element is controlled to a conduction state, the drive element is reliably set to a threshold state (a state in which a threshold voltage is applied) and thus variations in the threshold voltage of the drive element can be properly compensated for.

According to the third aspect of the present invention, since the fourth switching element is provided between the third power supply wiring line and the control terminal of the drive element, by controlling the fourth switching element to a conduction state, a potential of the third power supply wiring line can be provided to the control terminal of the drive element.

According to the fourth aspect of the present invention, during the first period, a potential of the third power supply wiring line is provided to the first electrode of the capacitor, a potential according to display data (hereinafter, also referred to as a data potential) is provided to the second electrode of the capacitor, and a difference between these two potentials is held in the capacitor. During the second period, the potential of the first electrode of the capacitor changes until the drive element goes into a threshold state, and accordingly, the potential difference held in the capacitor is changed to a difference between the data potential and the threshold voltage of the drive element. During the third period, with the capacitor holding the above-described potential difference, the potential of the second electrode of the capacitor is changed from the data potential to a potential of a predetermined power supply wiring line. Thus, the control terminal potential of the drive element after that is a potential obtained by adding a difference between the potential of the predetermined power supply wiring line and the data potential to a potential at which the drive element goes into a threshold state. Therefore, even when the threshold voltage is different, if the data potential is the same, then the amount of current flowing through the drive element is the same. In this manner, variations in the threshold voltage of the drive element can be compensated for.

According to the fifth aspect of the present invention, since the fourth switching element is provided between the third power supply wiring line and the current input/output terminal of the drive element and the terminal is connected to the third switching element, by controlling both the third and fourth switching elements to a conduction state, a potential of the third power supply wiring line can be provided to the control terminal of the drive element. Also, since the control terminal of the drive element is connected to the third power supply wiring line through the third and fourth switching elements, the number of switching elements connected to the control terminal of the drive element is smaller than the case in which the control terminal of the drive element is connected to the third power supply wiring line through the fourth switching element. Therefore, the control terminal potential of the drive element is less likely to fluctuate due to a less amount of leakage current flowing through a switching element. Thus, the luminance of the electro-optical element can be properly kept and display quality can be enhanced.

According to the sixth aspect of the present invention, during the first period, a potential of the third power supply wiring line is provided to the first electrode of the capacitor, a data potential is provided to the second electrode of the capacitor, and a difference between these two potentials is held in the capacitor. During the second period, the potential of the first electrode of the capacitor changes until the drive element goes into a threshold state, and accordingly, the potential difference held in the capacitor is changed to a difference between the data potential and the threshold voltage of the drive element. During the third period, with the capacitor holding the above-described potential difference, the potential of the second electrode of the capacitor is changed from the data potential to a potential of a predetermined power supply wiring line. Thus, the control terminal potential of the drive element after that is a potential obtained by adding a difference between the potential of the predetermined power supply wiring line and the data potential to a potential at which the drive element goes into a threshold state. Therefore, even when the threshold voltage is different, if the data potential is the same, then the amount of current flowing through the drive element is the same. In this manner, variations in the threshold voltage of the drive element can be compensated for.

According to the seventh aspect of the present invention, by controlling the second switching element to a conduction state, a potential of the first power supply wiring line can be provided to the second electrode of the capacitor. Hence, the potential of the control terminal of the drive element which is connected to the first electrode of the capacitor can be kept at a level according to display data.

According to the eighth aspect of the present invention, by diode-connecting the fourth switching element to the third power supply wiring line and switching the potential of the third power supply wiring line between predetermined levels, the fourth switching element can be switched to a conduction state and a non-conduction state and the drive element can be set to a conduction state. Accordingly, since a wiring line that controls the fourth switching element becomes unnecessary, the circuit size of the display device can be reduced.

According to the ninth aspect of the present invention, by controlling the second switching element to a conduction state, a potential of the third power supply wiring line can be provided to the second electrode of the capacitor. Accordingly, the potential of the control terminal of the drive element which is connected to the first electrode of the capacitor can be kept at a level according to display data.

According to the tenth aspect of the present invention, since the control terminal potential of the drive element increases or decreases according to a difference between a potential of the third power supply wiring line and a data potential, by controlling the potential of the third power supply wiring line, the luminance of all electro-optical elements can be uniformly adjusted. Accordingly, only by adding a small amount of circuit, without changing display data, a peak luminance adjustment can be easily performed.

According to the eleventh aspect of the present invention, by controlling the fifth switching element to a non-conduction state when writing to the pixel circuit, a current flowing through the electro-optical element from the drive element can be interrupted. Thus, the drive element can be properly set to a threshold state and unwanted light emission from the electro-optical element can be prevented.

According to the twelfth aspect of the present invention, by controlling the potential of the second power supply wiring line when writing to the pixel circuit, without providing a switching element between the first power supply wiring line and the second power supply wiring line, a current can be prevented from flowing through the electro-optical element. Thus, with a less amount of circuit, the drive element can be properly set to a threshold state and unwanted light emission from the electro-optical element can be prevented.

According to the thirteenth aspect of the present invention, an organic EL display that properly compensates for variations in the threshold voltage of the drive element can be obtained.

According to the fourteenth aspect of the present invention, by configuring the drive element and all switching elements in the pixel circuit using thin-film transistors, the pixel circuit can be easily fabricated with high precision.

According to the fifteenth aspect of the present invention, by configuring the drive element and all switching elements in the pixel circuit using transistors of the same channel type, all transistors can be fabricated using the same masks and by the same process, enabling to lower the cost of the display device. In addition, since transistors of the same channel type can be arranged closer to each other than transistors of different channel types, a saved pixel circuit area can be utilized for other purposes.

DESCRIPTION OF THE REFERENCE NUMERALS

10 and 40: DISPLAY DEVICE
11: DISPLAY CONTROL CIRCUIT
12: GATE DRIVER CIRCUIT
13: SOURCE DRIVER CIRCUIT
14: REFERENCE SUPPLY ADJUSTMENT CIRCUIT
21: SHIFT REGISTER
22: REGISTER
23: LATCH CIRCUIT
24: D/A CONVERTER
48: REFERENCE POTENTIAL CONTROL CIRCUIT
100, 200, 300, 400, 500, 600, and 700: PIXEL CIRCUIT
110, 210, 310, 410, 510, 610, and 710: DRIVING TFT
111 to 115, 211 to 214, 311 to 315, 411 to 415, 511 to 515, 611 to 615, and 711 to 715: SWITCHING TFT
120, 220, 320, 420, 520, 620, and 720: CAPACITOR
130, 230, 330, 430, 530, 630, and 730: ORGANIC EL ELEMENT
Vp: POWER SUPPLY WIRING LINE
Vs: REFERENCE SUPPLY WIRING LINE
Vcom: COMMON CATHODE
CAi: CATHODE WIRING LINE
Wi, Ri, and Ei: CONTROL LINE
Gi: SCANNING LINE
Sj: DATA LINE

BEST MODE FOR CARRYING OUT THE INVENTION

Display devices according to first to seventh embodiments of the present invention will be described below with reference to FIGS. 1 to 16. A display device according to each embodiment includes a pixel circuit including an electro-optical element, a drive element, a capacitor, and a plurality of switching elements. The pixel circuit includes an organic EL element as the electro-optical element; and a driving TFT and switching TFTs which are composed of CG silicon TFTs as the drive element and the switching elements. Note that the drive element and the switching elements can be composed of, for example, amorphous silicon TFTs or low-temperature polysilicon TFTs, in addition to CS silicon TFTs. By composing the drive element and the switching elements using TFTs, the pixel circuit can be easily fabricated with high precision.

The configuration of a CS silicon TFT is disclosed in Inukai, and seven others, "4.0-in. TFT-OLED Displays and a Novel Digital Driving Method", SID'00 Digest, pp. 924-927. A CG silicon TFT fabrication process is disclosed in Takayama, and five others, "Continuous Grain Silicon Technology and Its Applications for Active Matrix Display", AMD LCD 2000, pp. 25-28. The configuration of an organic EL element is disclosed in Friend, "Polymer Light-Emitting Diodes for use in Flat Panel Display", AM-LCD'01, pp. 211-214. Hence, description of these matters is omitted.

Figure 1:
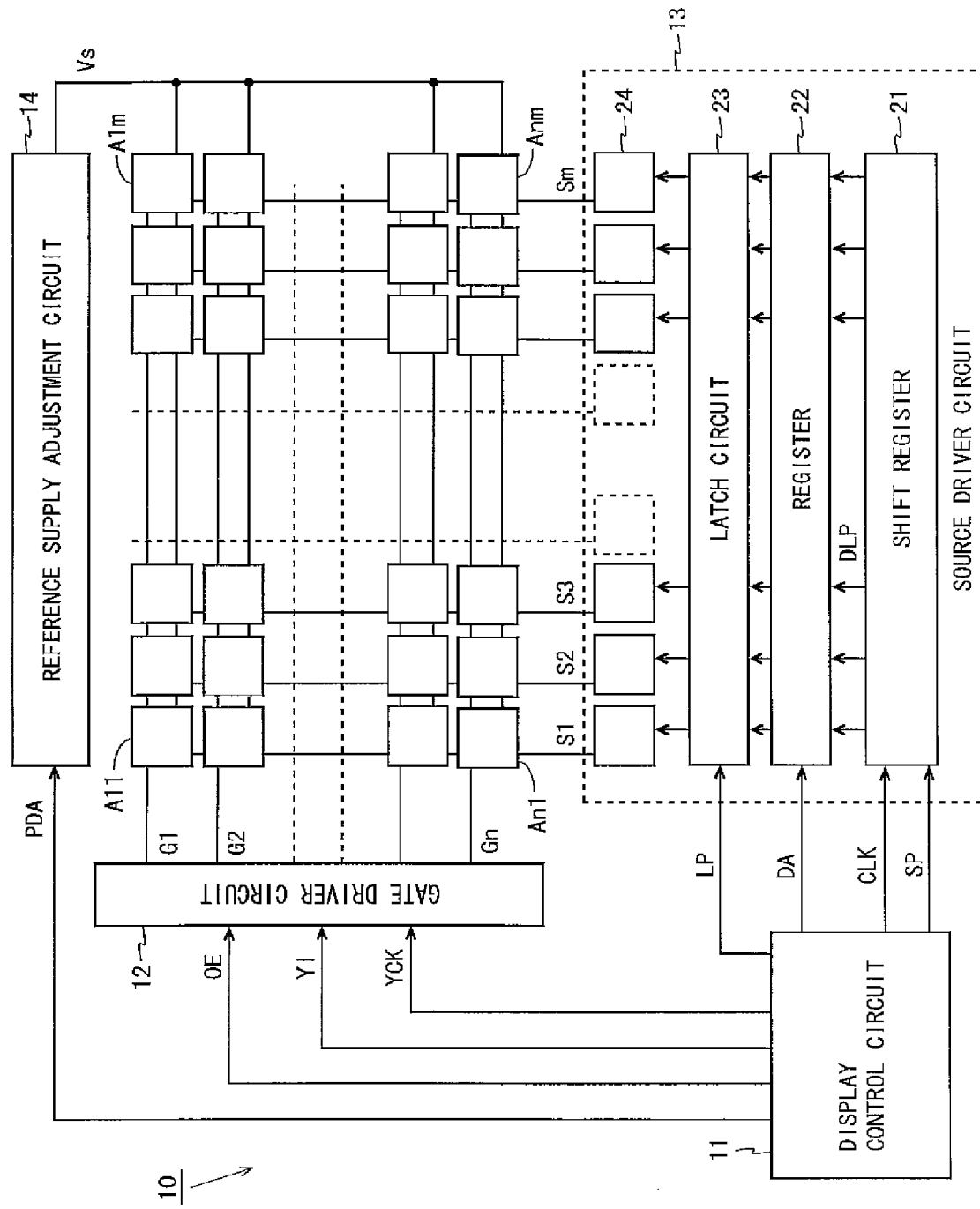
FIG. 1 is a block diagram showing a configuration of a display device according to first to seventh (excluding fourth) embodiments of the present invention.

FIG. 1 is a block diagram showing a configuration of a display device according to the first to seventh (excluding the fourth) embodiments of the present invention. A display device 10 shown in FIG. 1 includes a plurality of pixel circuits Aij (i is an integer greater than or equal to 1 and less than or equal to n and j is an integer greater than or equal to 1 and less than or equal to m); a display control circuit 11; a gate driver circuit 12; a source driver circuit 13; and a reference supply adjustment circuit 14. In the display device 10, a plurality of scanning lines Gi parallel to one another and a plurality of data lines Sj parallel to one another and orthogonal to the scanning lines Gi are provided. The pixel circuits Aij are arranged in a matrix form so as to correspond to respective intersections of the scanning lines Gi and the data lines Sj.

In addition to this, in the display device 10, a plurality of control lines (Wi, Ri, etc., which are not shown) parallel to one another are arranged in parallel to the scanning lines Gi. The scanning lines Gi and the control lines are connected to the gate driver circuit 12 and the data lines Sj are connected to the source driver circuit 13. The gate driver circuit 12 and the source driver circuit 13 function as drive circuits for the pixel circuits Aij.

The display control circuit 11 outputs a timing signal OE, a start pulse YI, and a clock YCK to the gate driver circuit 12, outputs a start pulse SP, a clock CLK, display data DA, and a latch pulse LP to the source driver circuit 13, and outputs a voltage control signal PDA to the reference supply adjustment circuit 14.

The gate driver circuit 12 includes a shift register circuit, a logic operation circuit, and a buffer (none of which are shown). The shift register circuit sequentially transfers the start pulse Y1 in synchronization with the clock YCK. The logic operation circuit performs a logic operation between a pulse outputted from each stage of the shift register circuit and the timing signal OE. An output from the logic operation circuit is provided to a corresponding scanning line Gi, corresponding control lines Wi, Ri, etc., through the buffer. As such, the gate driver circuit 12 functions as a scanning signal output circuit that selects a write-target pixel circuit using a corresponding scanning line Gi.

The source driver circuit 13 includes an m-bit shift register 21, a register 22, a latch circuit 23, and m D/A converters 24. The shift register 21 includes m cascade-connected one-bit registers. The shift register 21 sequentially transfers the start pulse SP in synchronization with the clock CLK and outputs timing pulses DLP from the registers of the respective stages. In accordance with output timing of the timing pulses DLP, the display data DA is supplied to the register 22. The register 22 stores the display data DA according to the timing pulses DLP. When an amount of the display data DA corresponding to one row is stored in the register 22, the display control circuit 11 outputs the latch pulse LP to the latch circuit 23. When the latch circuit 23 receives the latch pulse LP, the latch circuit 23 holds the display data stored in the register 22. The D/A converters 24 are provided to the data lines Sj on a one-to-one basis. The D/A converters 24 convert the display data held in the latch circuit 23 to analog signal voltages and provide the analog signal voltages to corresponding data lines Sj. As such, the source driver circuit 13 functions as a display signal output circuit that provides potentials according to display data to the data lines Sj.

Note that in order for the display device 10 to achieve reduction in size and cost, it is desirable that all or part of the gate driver circuit 12 and the source driver circuit 13 be formed on the same substrate as that for the pixel circuits Aij, using CG silicon TFTs or polycrystal silicon TFTs.

The reference supply adjustment circuit 14 adjusts the level of a potential (hereinafter, referred to as the reference potential Vstd) to be applied to a reference supply wiring line Vs, based on the voltage control signal PDA. All of the pixel circuits Aij are connected to the reference supply wiring line Vs and receive a supply of the reference potential Vstd from the reference supply adjustment circuit 14. Though not shown in FIG. 1, in a region where the pixel circuits Aij are arranged, a power supply wiring line Vp and a common cathode Vcom (or a cathode wiring line CAi) are arranged to supply a supply voltage to the pixel circuits Aij.

The pixel circuits Aij included in the display device according to each embodiment will be described in detail below. In the following description, a high-level potential provided to a gate terminal of a switching TFT is referred to as GH and a low-level potential is referred to as GL. Also, although in the following description the channel type of each TFT is fixedly determined, provided that an appropriate control signal can be supplied to a gate terminal of each TFT, each TFT may be of either a p-channel type or an n channel type.

(First Embodiment)

Figure 2:
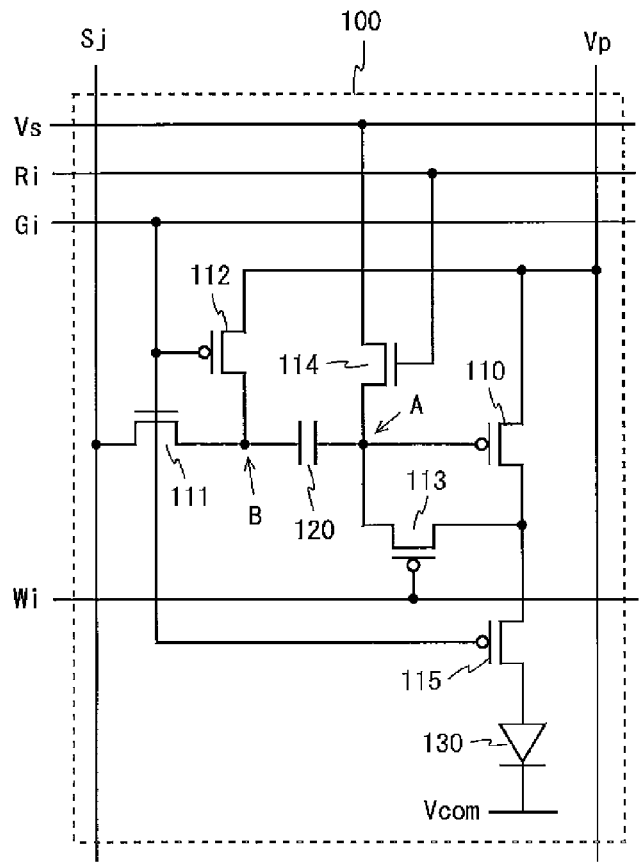
FIG. 2 is a circuit diagram of a pixel circuit included in a display device according to the first embodiment of the present invention.

FIG. 2 is a circuit diagram of a pixel circuit included in a display device according to the first embodiment of the present invention, A pixel circuit 100 shown in FIG. 2 includes a driving TFT 110, switching TFTs 111 to 115, a capacitor 120, and an organic EL element 130. The switching TFTs 111 and 114 are of an n-channel type and other TFTs are of a p-channel type.

The pixel circuit 100 is connected to a power supply wiring line Vp, a reference supply wiring line Vs, a common cathode Vcom, a scanning line Gi, control lines Wi and Ri, and a data line Sj. Of them, to the power supply wiring line Vp (first power supply wiring line) and the common cathode Vcom (second power supply wiring line) are respectively applied fixed potentials VDD and VSS and to the reference supply wiring line Vs (third power supply wiring line) is applied a reference potential Vstd obtained by the reference supply adjustment circuit 14. The common cathode Vcom serves as a common electrode for all organic EL elements 130 in the display device.

In the pixel circuit 100, on a path connecting the power supply wiring line Vp to the common cathode Vcom, in order from the side of the power supply wiring line Vp, the driving TFT 110, the switching TFT 115, and the organic EL element 130 are provided in series. One electrode of the capacitor 120 is connected to a gate terminal of the driving TFT 110. Between the other electrode of the capacitor 120 and the data line Sj, the switching TFT 111 is provided. Hereinafter, a connection point between the driving TFT 110 and the capacitor 120 is referred to as A and a connection point between the capacitor 120 and the switching TFT 111 is referred to as B. The switching TFT 112 is provided between the connection point B and the power supply wiring line Vp, the switching TFT 113 is provided between the connection point A and a drain terminal of the driving TFT 110, and the switching TFT 114 is provided between the connection point A and the reference supply wiring line Vs.

Gate terminals of the respective switching TFTs 111, 112, and 115 are connected to the scanning line Gi, a gate terminal of the switching TFT 113 is connected to the control line Wi, and a gate terminal of the switching TFT 114 is connected to the control line Ri. The potentials of the scanning line Gi and the control lines Wi and Ri are controlled by the gate driver circuit 12 and the potential of the data line Sj is controlled by the source driver circuit 13.

Figure 3:
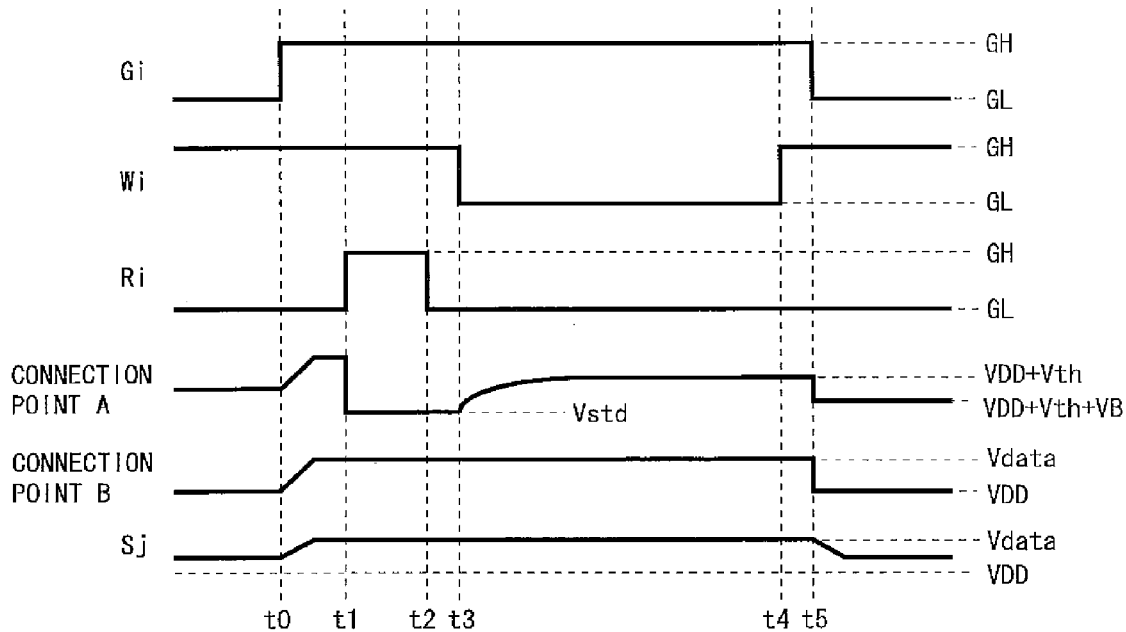
FIG. 3 is a timing chart of the pixel circuit shown in FIG. 2.

FIG. 3 is a timing chart of the pixel circuit 100. FIG. 3 shows changes in potentials applied to the scanning line Gi, the control lines Wi and Ri, and the data line Sj and changes in potentials at the connection points A and B. In FIG. 3, the period from time t0 to time t5 corresponds to one horizontal scanning period. With reference to FIG. 3, the operation of the pixel circuit 100 will be described below.

Before time t0, the potentials of the scanning line Gi and the control line Ri are controlled to CL (low level) the potential of the control line Wi is controlled to GH (high level), and the potential of the data line Sj is controlled to a level according to display data for the last time (display data written to a pixel circuit in an adjacent upper row). Thus, the switching TFTs 112 and 115 are in a conduction state and the switching TFTs 111, 113, and 114 are in a non-conduction state. The potential at the connection point A is a potential according to display data written to the pixel circuit 100 last time and the potential at the connection point B is VDD.

When at time t0 the potential of the scanning line Gi is changed to GH, the switching TFT 111 is changed to a conduction state and the switching TFTs 112 and 115 are changed to a non-conduction state. Since, while the potential of the scanning line Gi is GH (during the period from time t0 to time t5), the switching TFT 115 is in a non-conduction state, a current does not flow through the organic EL element 130 and thus the organic EL element 130 does not emit light.

While the potential of the scanning line Gi is GH, the potential of the data line Sj is controlled to a potential of a level according to display data for this time (hereinafter, referred to as the data potential Vdata). During this period, the connection point B is connected to the data line Sj through the switching TFT 111, and thus, the potential at the connection point B is Vdata. During the period from time t0 to time t1, the switching TFTs 113 and 114 are in a non-conduction state, and thus, when the potential at the connection point B is changed from VDD to Vdata, the potential at the connection point A is also changed by the same amount (Vdata−VDD).

Then, when at time t1 the potential of the control line Ri is changed to GH, the switching TFT 114 is changed to a conduction state. Thus, the connection point A is connected to the reference supply wiring line Vs through the switching TFT 114 and thus the potential at the connection point A is changed to Vstd. At this time, since the connection point B is connected to the data line Sj through the switching TFT 111, even when the potential at the connection point A is changed, the potential at the connection point B remains at Vdata.

The reference potential Vstd of the reference supply wiring line Vs is determined such that the driving TFT 110 goes into a conduction state when the reference potential Vstd is applied to the gate terminal. Hence, after time t1, the driving TFT 110 is surely in a conduction state. Note that even when the driving TFT 110 goes into a conduction state, while the switching TFT 115 is in a non-conduction state, a current does not flow through the organic EL element 130 and thus the organic EL element 130 does not emit light.

Then, when at time t2 the potential of the control line Ri is changed to GL, the switching TFT 114 is changed to a non-conduction state. Thus, the connection point A is disconnected from the reference supply wiring line Vs and thus the potential at the connection point A is fixed. At this timer a potential difference (Vstd−Vdata) between the connection points A and B is held in the capacitor 120.

Then, when at time t3 the potential of the control line Wi is changed to GL, the switching TFT 113 is changed to a conduction state. Thus, the gate and drain terminals of the driving TFT 110 are short-circuited, whereby the driving TFT 110 forms a diode connection. During the period from time t1 to time t2, the reference potential Vstd is applied to the connection point A and after time t2 too, the potential at the connection point A is kept at Vstd by the capacitor 120. Therefore, after time t3 too, the driving TFT 110 is surely in a conduction state.

A current flows into the connection point A from the power supply wiring line Vp through the driving TFT 110 and the switching TFT 113, and the potential at the connection point A (gate terminal potential of the driving TFT 110) rises while the driving TFT 110 is in a conduction state. The driving TFT 110 is changed to a non-conduction state when the gate-source voltage becomes a threshold voltage Vth (negative value) (i.e., the potential at the connection point A becomes (VDD+Vth)). Therefore, the potential at the connection point A rises to (VDD+Vth) and the driving TFT 110 goes into a threshold state (a state in which a threshold voltage is applied between the gate and the source).

Then, when at time t4 the potential of the control line Wi is changed to GH, the switching TFT 113 is changed to a non-conduction state. At this time, a potential difference (VDD+Vth−Vdata) between the connection points A and B is held in the capacitor 120.

Then, when at time t5 the potential of the scanning line Gi is changed to GL, the switching TFTs 112 and 115 are changed to a conduction state and the switching TFT 111 is changed to a non-conduction state. Thus, the connection point B is disconnected from the data line Sj and connected to the power supply wiring line Vp through the switching TFT 112. Hence, the potential at the connection point B is changed from Vdata to VDD and accordingly the potential at the connection point A is also changed by the same amount (VDD−Vdata; hereinafter, referred to as VB) and becomes (VDD+Vth+VB).

After time t5, the switching TFT 115 is in a conduction state and thus a current flows through the organic EL element 130 from the power supply wiring line Vp through the driving TFT 110 and the switching TFT 115. Although the amount of current flowing through the driving TFT 110 increases or decreases depending on the gate terminal potential (VDD+

Vth+VB), even when the threshold voltage Vth is different, if the potential difference VB (=VDD−Vdata) is the same, then the amount of current is the same. Therefore, regardless of the value of the threshold voltage Vth of the driving TFT 110, a current of an amount according to the data potential Vdata flows through the organic EL element 130 and thus the organic EL element 130 emits light with a specified luminance.

In the above-described operation, after the switching TFT 114 is changed to a non-conduction state at time t2, at time t3 the switching TFT 113 is changed to a conduction state. Thus, a current is prevented from flowing into the reference supply wiring line Vs from the power supply wiring line Vp through the driving TFT 110 and the switching TFTs 113 and 114 and thus the potential of the reference supply wiring line Vs can be kept stable. In addition, since the potential difference held in the capacitor 120 at time t2 does not change, variations in threshold voltage can be precisely compensated for.

In the above-described operation, after the switching TFT 113 is changed to a non-conduction state at time t4, at time t5 the switching TFT 111 is changed to a non-conduction state and the switching TFT 112 is changed to a conduction state. Thus, a current is prevented from flowing into the connection point A from the power supply wiring line Vp through the driving TFT 110 and the switching TFT 113 and thus the gate terminal potential of the driving TFT 110 can be kept precisely.

As described above, according to the display device according to the present embodiment, by applying the reference potential Vstd that brings the driving TFT 110 into a conduction state to the reference supply wiring line Vs and controlling the switching TFT 114 to a conduction state, the reference potential Vstd is provided to the gate terminal of the driving TFT 110 and regardless of a previous state of the pixel circuit, the driving TFT 110 can be surely set to a conduction state.

Therefore, when, after that, the switching TFT 113 is controlled to a conduction state and the switching TFT 115 is controlled to a non-conduction state, the driving TFT 110 can be reliably set to a threshold state and the current flowing through the organic EL element 130 from the driving TFT 110 can be interrupted. Thus, the driving TFT 110 can be properly set to a threshold state and unwanted light emission from the organic EL element 130 can be prevented. When unwanted light emission can be prevented, the contrast of a display screen improves and the lifetime of the organic EL element 130 is also extended.

In order to set the driving TFT 110 of a p-channel type to a conduction state, the reference potential Vstd to be applied to the gate terminal needs to be lowered than the source terminal potential of the driving TFT 110 by an amount greater than or equal to the threshold voltage Vth. However, if the reference potential Vstd is lowered too much, it takes time for the driving TFT 110 to go into a threshold state, and thus a process of compensating for variations in the threshold voltage of the driving TFT 110 may not be completed during one horizontal scanning period. Hence, it is desirable that the reference potential Vstd be a potential as close to (VDD+Vth) as possible, provided that the reference potential Vstd satisfies the condition that the driving TFT 110 goes into a conduction state when the reference potential Vstd is provided to the gate terminal.

Since the pixel circuit 100 operates based on the reference potential Vstd provided externally, the level of the reference potential Vstd can be freely set using the reference supply adjustment circuit 14, etc. Therefore, according to the display device according to the present embodiment, by using the reference potential Vstd close to (VDD+Vth), variations in the threshold voltage of the driving TFT can be compensated for in a short period of time.

Before the driving TFT 110 is brought into a threshold state, a potential difference (Vstd-Vdata) is held in the capacitor 120. This potential difference is the same for all pixel circuits. Thus, even if the driving TFT 110 cannot be completely set to a threshold state, variations in the luminance of the organic EL element can be made small.

(Second Embodiment)

Figure 4:
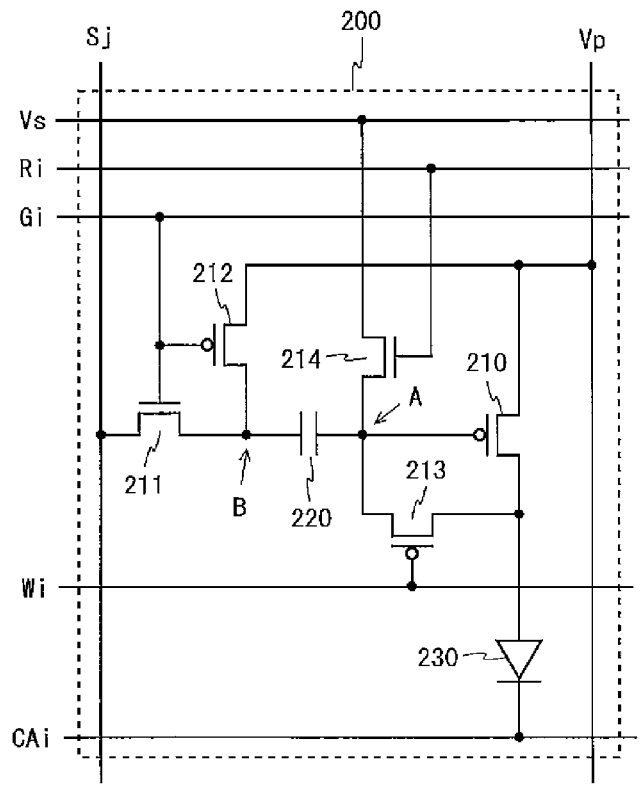
FIG. 4 is a circuit diagram of a pixel circuit included in a display device according to the second embodiment of the present invention.

FIG. 4 is a circuit diagram of a pixel circuit included in a display device according to the second embodiment of the present invention. A pixel circuit 200 shown in FIG. 4 includes a driving TFT 210, switching TFTs 211 to 214, a capacitor 220, and an organic EL element 230. The switching TFTs 211 and 214 are of an n-channel type and other TFTs are of a p-channel type.

The pixel circuit 200 is obtained by making a change to the pixel circuit 100 (FIG. 2) according to the first embodiment such that the switching TFT 115 is eliminated and a cathode terminal of the organic EL element 130 is connected to a cathode wiring line CAi (second power supply wiring line). In the pixel circuit 200, on a path connecting a power supply wiring line Vp to the cathode wiring line CAi, in order from the side of the power supply wiring line Vp, the driving TFT 210 and the organic EL element 230 are provided in series. Except for the above points, the configuration of the pixel circuit 200 is the same as that of the pixel circuit 100. The potential of the cathode wiring line CAi is controlled by a power supply switching circuit (not shown) included in the display device 10.

Figure 5:
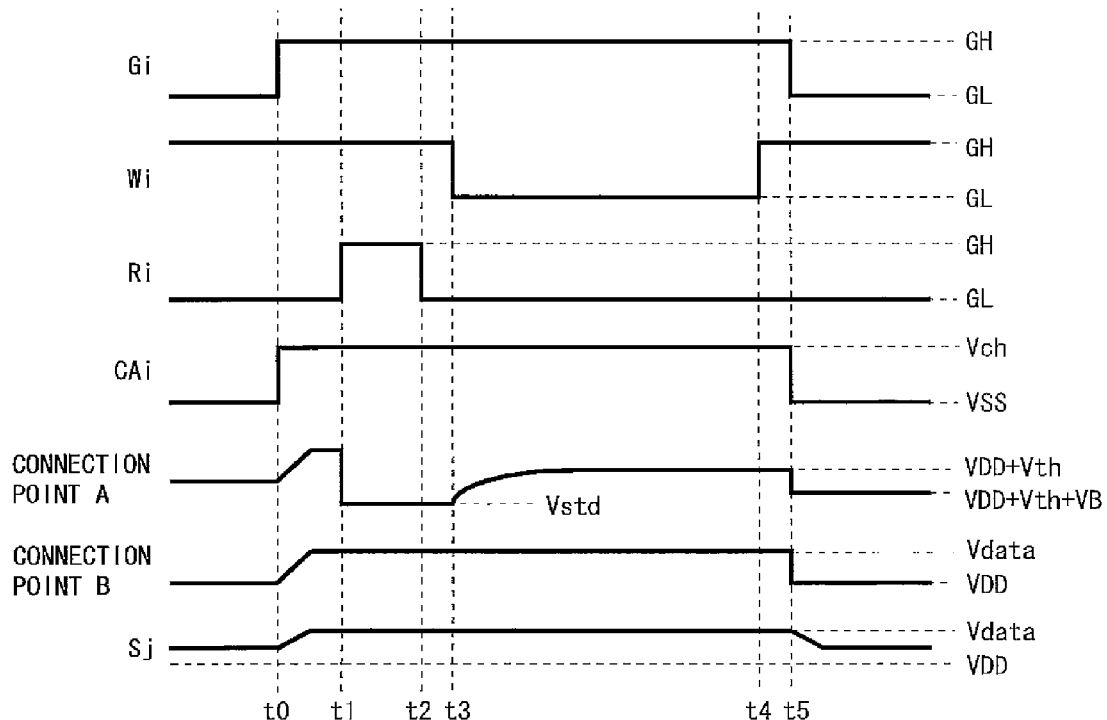
FIG. 5 is a timing chart of the pixel circuit shown in FIG. 4.

FIG. 5 is a timing chart of the pixel circuit 200. FIG. 5 shows changes in potentials applied to a scanning line Gi, control lines Wi and Ri, the cathode wiring line CAi, and a data line Sj and changes in potentials at connection points A and B. In FIG. 5, the period from time t0 to time t5 corresponds to one horizontal scanning period.

As shown in FIG. 5, the potential of the cathode wiring line CAi is controlled to a predetermined level Vch during the period from time t0 to time t5 and controlled to VSS during other times. The potential Vch is determined such that when a potential VDD is applied to one end of a circuit made by connecting the driving TFT 210 to the organic EL element 230 in series and the potential Vch is applied to the other end, an applied voltage to the organic EL element 230 is lower than a light-emission threshold voltage of the organic EL element 230. Hence, while the potential of the cathode wiring line CAi is Vch (during the period from time t0 to time t5), a current contributing to light emission does not flow through the organic EL element 230 and thus the organic EL element 230 does not emit light. Except for the above points, the operation of the pixel circuit 200 is the same as that of the pixel circuit 100.

As described above, in the display device according to the present embodiment, when writing to the pixel circuit, the potential of the cathode wiring line CAi is controlled to a level at which a current does not flow through the organic EL element 230. Therefore, even without providing a switching TFT on a path connecting the power supply wiring line Vp to the cathode wiring line CAi, the same effect (of properly compensating for variations in the threshold voltage of the driving TFT in a short period of time and preventing unwanted light emission from the organic EL element) as that obtained in the first embodiment can be obtained.

(Third Embodiment)

Figure 6:
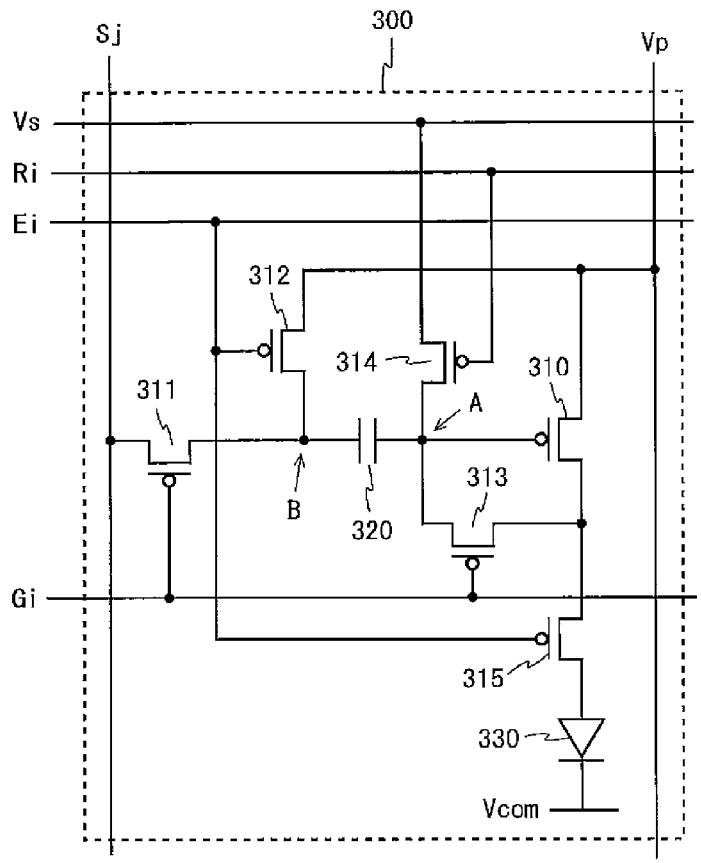
FIG. 6 is a circuit diagram of a pixel circuit included in a display device according to the third embodiment of the present invention.

FIG. 6 is a circuit diagram of a pixel circuit included in a display device according to the third embodiment of the present invention. A pixel circuit 300 shown in FIG. 6 includes a driving TFT 310, switching TFTs 311 to 315, a capacitor 320, and an organic EL element 330. All of the TFTs included in the pixel circuit 300 are of a p-channel type.

The pixel circuit 300 is obtained by making a change to the pixel circuit 100 (FIG. 2) according to the first embodiment such that the TFTs of an n-channel type are changed to TFT of a p-channel type and a gate terminal of each TFT is connected to an appropriate signal line. In the pixel circuit 300, gate terminals of the respective switching TFTs 311 and 313 are connected to a scanning line Gi, gate terminals of the respective switching TFTs 312 and 315 are connected to a control line Ei, and a gate terminal of the switching TFT 314 is connected to a control line Ri. Except for the above points, the configuration of the pixel circuit 300 is the same as that of the pixel circuit 100. The potential of the control line Ei is controlled by the gate driver circuit 12.

Figure 7:
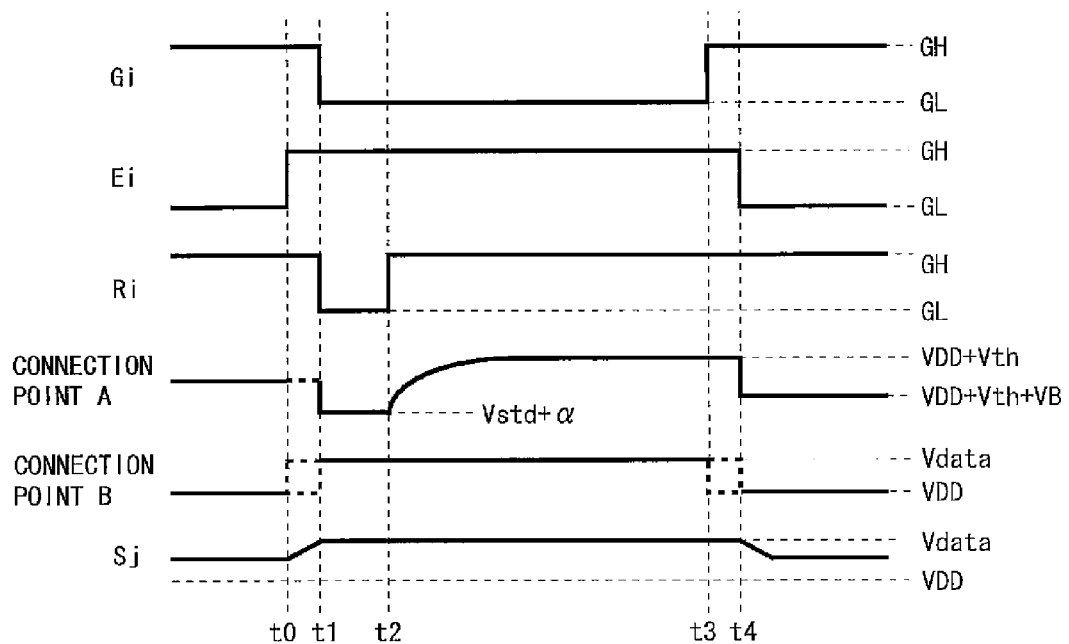
FIG. 7 is a timing chart of the pixel circuit shown in FIG. 6.

FIG. 7 is a timing chart of the pixel circuit 300. FIG. 7 shows changes in potentials applied to the scanning line Gi, the control lines Ei and Ri, and a data line Sj and changes in potentials at connection points A and B. In FIG. 7, the period from time t0 to time t4 corresponds to one horizontal scanning period. With reference to FIG. 7, the operation of the pixel circuit 300 will be described below.

Before time t0, the potentials of the scanning line Gi and the control line Ri are controlled to GH, the potential of the control line Ei is controlled to GL, and the potential of the data line Sj is controlled to a level according to display data for the last time. Thus, the switching TFTs 312 and 315 are in a conduction state and the switching TFTs 311, 313, and 314 are in a non-conduction state. The potential at the connection point A is a potential according to display data written to the pixel circuit 300 last time and the potential at the connection point B is VDD.

When at time t0 the potential of the control line Ei is changed to GH, the switching TFTs 312 and 315 are changed to a non-conduction state. Since, while the potential of the control line Ei is GH (during the period from time t0 to time t4), the switching TFT 315 is in a non-conduction state, a current does not flow through the organic EL element 330 and thus the organic EL element 330 does not emit light.

While the potential of the control line Ei is GH, the potential of the data line Sj is controlled to a data potential Vdata. Since, during the period from time t0 to time t1, the connection points A and B are disconnected from wiring lines to which potentials are applied, the potentials at the connection points A and B become undefined (in fact, the potentials do not change from the level at time t0).

Then, when at time t1 the potentials of the scanning line Gi and the control line Ri are changed to GL, the switching TFTs 311, 313, and 314 are changed to a conduction state. Thus, the connection point B is connected to the data line Sj through the switching TFT 311, and thus, the potential at the connection point B is changed to Vdata. Since the connection point A is connected to a reference supply wiring line Vs through the switching TFT 314, the potential at the connection point A is changed to Vstd. The reference potential Vstd of the reference supply wiring line Vs is, as with the first embodiment, determined such that the driving TFT 310 goes into a conduction state when the reference potential Vstd is applied to the gate terminal. Hence, after time t1, the driving TFT 310 is surely in a conduction state. Note that even when the driving TFT 310 goes into a conduction state, while the switching TFT 315 is in a non-conduction state, a current does not flow through the organic EL element 330 and thus the organic EL element 330 does not emit light.

On the other hand, when the switching TFT 313 goes into a conduction state, the gate and drain terminals of the driving TFT 310 are short-circuited, whereby the driving TFT 310 forms a diode connection. Hence, a current flows into the connection point A from a power supply wiring line Vp through the driving TFT 310 and the switching TFT 313 and thus the potential at the connection point A rises by an amount corresponding to the current flown into. Accordingly, the potential at the connection point A becomes, strictly speaking, a potential (Vstd+α) which is a little higher than the reference potential Vstd.

Then, when at time t2 the potential of the control line Ri is changed to GH, the switching TFT 314 is changed to a non-conduction state. Thus, the current flowing through the connection point A from the reference supply wiring line Vs through the switching TFT 314 is interrupted. Instead of this, a current flows into the connection point A from the power supply wiring line Vp through the driving TFT 310 and the switching TFT 313, and the potential at the connection point A (the gate terminal potential of the driving TFT 310) rises while the driving TFT 310 is in a conduction state. The driving TFT 310 is changed to a non-conduction state when the gate-source voltage becomes a threshold voltage Vth (negative value) (i.e., the potential at the connection point A becomes (VDD+Vth)). Therefore, the potential at the connection point A rises to (VDD+Vth) and the driving TFT 310 goes into a threshold state.

Then, when at time t3 the potential of the scanning line Gi is changed to GH, the switching TFTs 311 and 313 are changed to a non-conduction state. At this time, a potential difference (VDD+Vth−Vdata) between connection points A and B is held in the capacitor 320.

Then, when at time t4 the potential of the control line Ei is changed to GL, the switching TFTs 312 and 315 are changed to a conduction state. Thus, the connection point B is connected to the power supply wiring line Vp through the switching TFT 312. At this time, the potential at the connection point B is changed from Vdata to VDD and accordingly the potential at the connection point A is changed by the same amount (VDD−Vdata; hereinafter, referred to as VB) and becomes (VDD+Vth+VB).

After time t4, the switching TFT 315 is in a conduction state and thus a current flows through the organic EL element 330 from the power supply wiring line Vp through the driving TFT 310 and the switching TFT 315. Although the amount of current flowing through the driving TFT 310 increases or decreases depending on the gate terminal potential (VDD+Vth+VB), even when the threshold voltage Vth is different, if the potential difference VB (=VDD−Vdata) is the same, then the amount of current is the same. Therefore, regardless of the value of the threshold voltage Vth of the driving TFT 310, a current of an amount according to the data potential Vdata flows through the organic EL element 330 and thus the organic EL element 330 emits light with a specified luminance.

As described above, in the pixel circuit 300, the driving TFT 310 and all of the switching TFTs 311 to 315 are composed of transistors of the same channel type. Even the display device according to the present embodiment including such a pixel circuit 300 can obtain the same effect as that obtained in the first embodiment by supplying an appropriate control signal to the gate terminal of each TFT. In addition, since transistors of the same channel type can be fabricated using the same masks and by the same process, the cost of the display device can be reduced. Also, since transistors of the same channel type can be arranged closer to each other than transistors of different channel types, a saved pixel circuit area can be utilized for other purposes.

(Fourth Embodiment)

Figure 8:
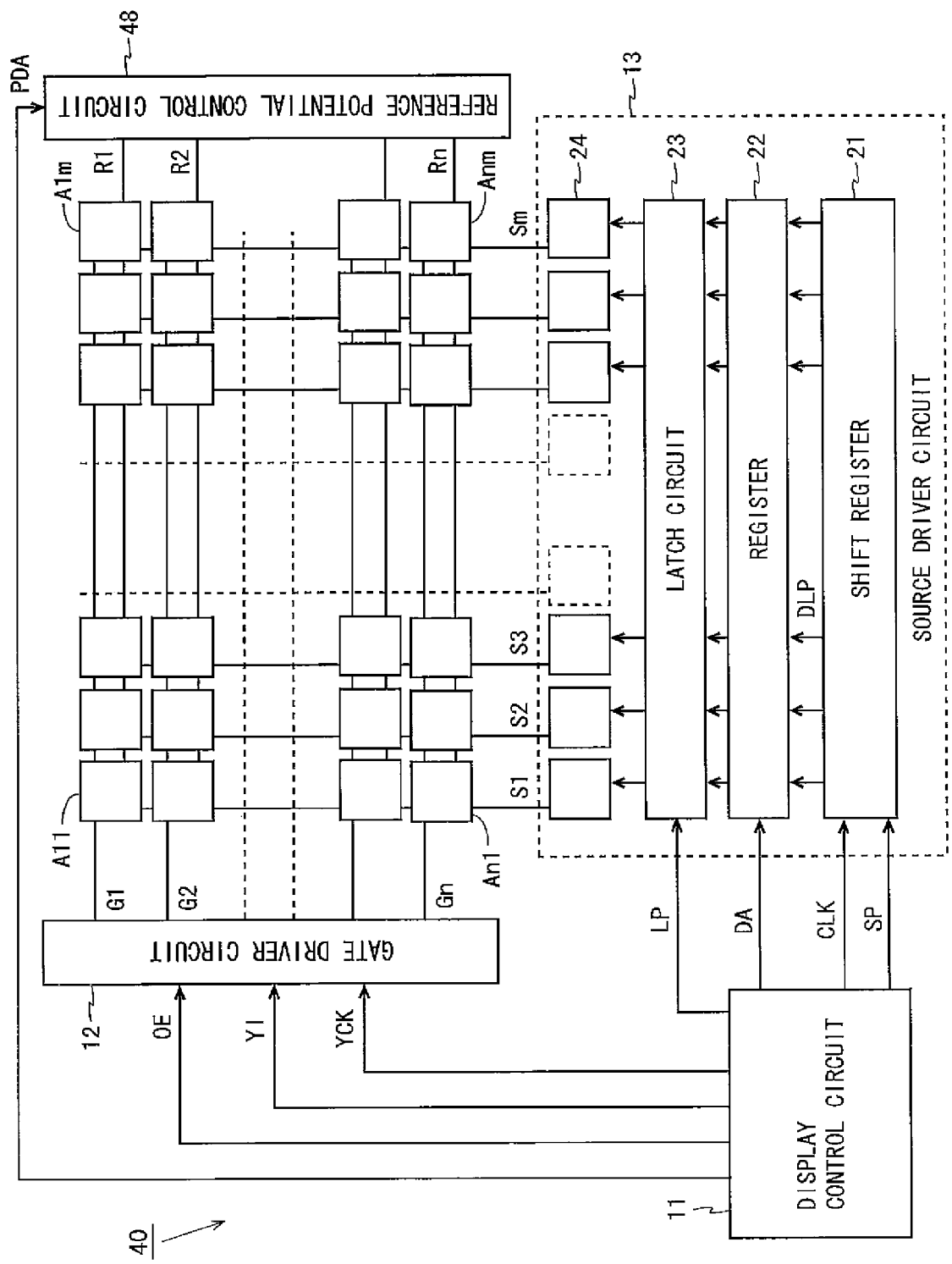
FIG. 8 is a block diagram showing a configuration of a display device according to the fourth embodiment of the present invention.

FIG. 8 is a block diagram showing a configuration of a display device according to the fourth embodiment of the present invention. A display device 40 shown in FIG. 8 is such that in the display device 10 shown in FIG. 1 the reference supply adjustment circuit 14 is replaced by a reference potential control circuit 48. In the display device 40, in order to supply a reference potential to pixel circuits Aij, instead of the reference supply wiring line Vs connected to all pixel circuits Aij, n control lines Ri connected to the respective rows of the pixel circuits Aij are used.

The reference potential control circuit 48 adjusts the levels of two types of reference potential (hereinafter, referred to as Vsh and Vsl) based on a voltage control signal PDA. The reference potential control circuit 48 is connected to the n control lines Ri and individually switches the potentials of the control lines Ri between Vsh and Vsl.

Figure 9:
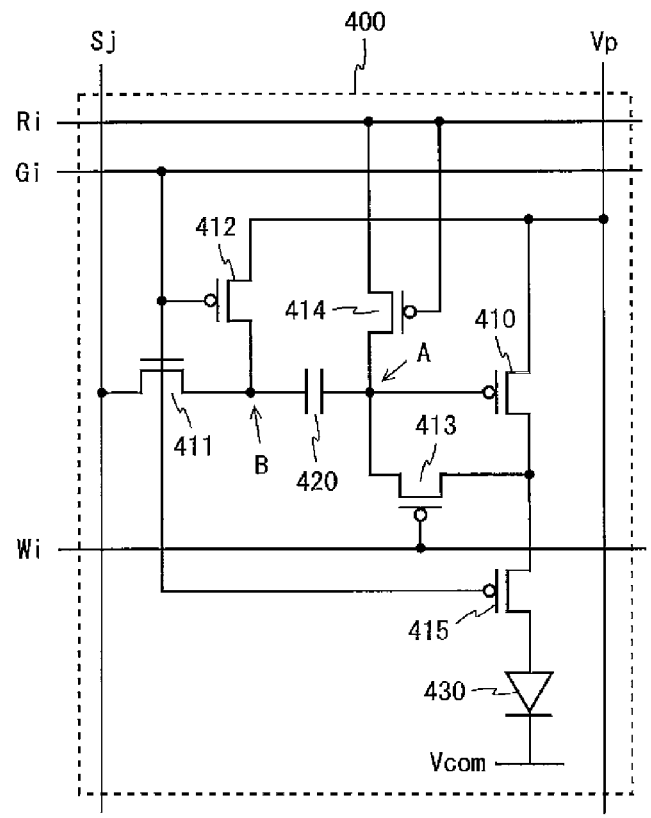
FIG. 9 is a circuit diagram of a pixel circuit included in the display device according to the fourth embodiment of the present invention.

FIG. 9 is a circuit diagram of a pixel circuit included in the display device according to the fourth embodiment of the present invention. A pixel circuit 400 shown in FIG. 9 includes a driving TFT 410, switching TFTs 411 to 415, a capacitor 420, and an organic EL element 430. The switching TFT 411 is of an n-channel type and other TFTs are of a p-channel type.

The pixel circuit 400 is obtained by making a change to the pixel circuit 100 (FIG. 2) according to the first embodiment such that the switching TFT 114 is changed to a TFT of a p channel type and the changed TFT is diode connected to a control line Ri. In the pixel circuit 400, both gate and drain terminals of the switching TFT 414 are connected to the control line Ri (third power supply wiring line). Except for the above points, the configuration of the pixel circuit 400 is the same as that of the pixel circuit 100.

Figure 10:
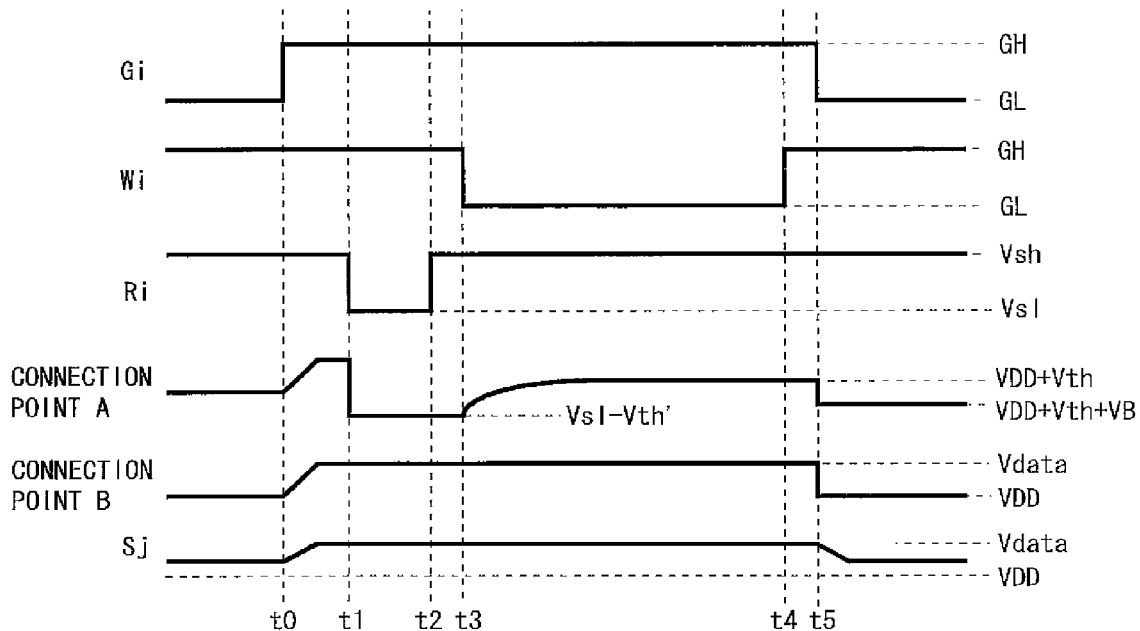
FIG. 10 is a timing chart of the pixel circuit shown in FIG. 9.

FIG. 10 is a timing chart of the pixel circuit 400. FIG. 10 shows changes in potentials applied to a scanning line Gi, control lines Wi and Ri, and a data line Sj and changes in potentials at connection points A and B. In FIG. 10, the period from time t0 to time t5 corresponds to one horizontal scanning period. With reference to FIG. 10, differences in operation between the pixel circuit 400 and the pixel circuit 100 will be described below.

As shown in FIG. 10, the potential of the control line Ri is controlled to Vsl during the period from time t1 to time t2 and controlled to Vsh during other times. The reference potentials Vsh and Vsl are determined to satisfy conditions which will be described later.

When at time t1 the potential of the control line Ri is changed to Vsl, both a gate terminal potential and a drain terminal potential of the switching TFT 414 are changed to Vsl. The switching TFT 414 of a p-channel type goes into a conduction state when the gate-source voltage is lower than a threshold voltage (i.e., when the potential Vsl is lower than the potential at the connection point A by an amount greater than or equal to the threshold voltage of the switching TFT 414).

When the switching TFT 414 goes into a conduction state, a current flows out to the control line Ri from the connection point A through the switching TFT 414 and the potential at the connection point A drops while the switching TFT 414 is in a conduction state. The switching TFT 414 is changed to a non-conduction state when the gate-source voltage becomes a threshold voltage Vth' (negative voltage) (i.e., the potential at the connection point A becomes (Vsl−Vth')). Thus the potential at the connection point A drops to (Vsl−Vth'). Furthermore, when the potential at the connection point A at this time is lower than the source terminal potential of the driving TFT 410 by an amount greater than or equal to the threshold voltage Vth (negative value) (i.e., when Vsl−Vth'<VDD+Vth is satisfied), the driving TFT 410 goes into a conduction state.

Hence, the reference potential Vsl is determined such that regardless of a previous potential at the connection point A, when the reference potential Vsl is applied to the gate terminal of the switching TFT 414, the switching TFT 414 goes into a conduction state and furthermore the driving TFT 410 goes into a conduction state. On the other hand, the reference potential Vsh is determined such that regardless of a previous potential at the connection point A, when the reference potential Vsh is applied to the gate terminal of the switching TFT 414, the switching TFT 414 goes into a non-conduction state. By switching the potential of the control line Ri between Vsh and Vsl that satisfy these conditions, the driving TFT 410 can be set to a conduction state using only one control line.

As described above, in the pixel circuit 400, by switching the potential of the control line Ri between Vsh and Vsl with the switching TFT 414 being diode-connected to the control line Ri, the switching TFT 414 is switched to a conduction state and a non-conduction state and the driving TFT 410 can be set to a conduction state. Accordingly, even with the display device according to the present embodiment including the pixel circuit 400, the same effect as that obtained in the first embodiment can be obtained. In addition, since a wiring line that controls the switching TFT 414 becomes unnecessary, the circuit size of the display device can be reduced.

(Fifth Embodiment)

Figure 11:
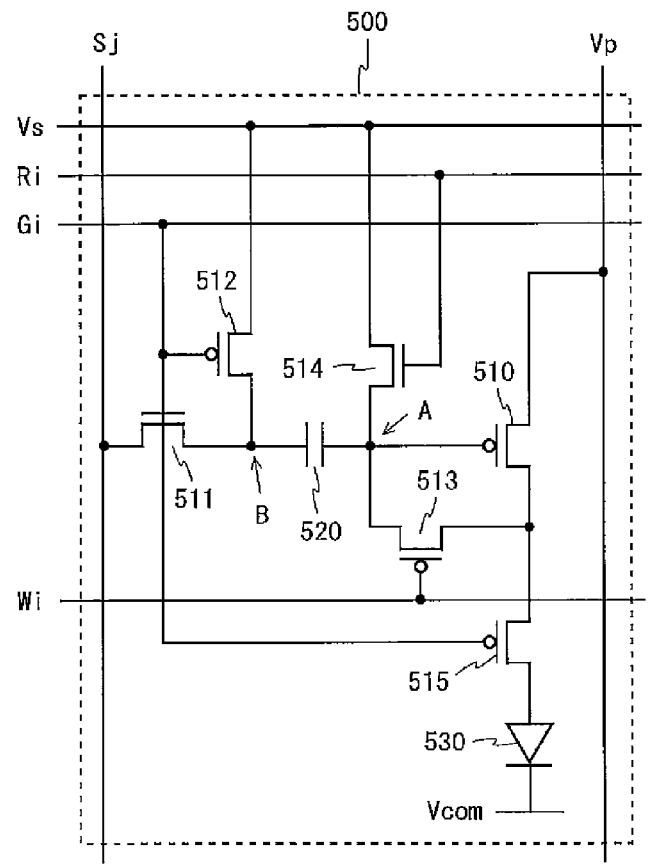
FIG. 11 is a circuit diagram of a pixel circuit included in a display device according to the fifth embodiment of the present invention.

FIG. 11 is a circuit diagram of a pixel circuit included in a display device according to the fifth embodiment of the present invention. A pixel circuit 500 shown in FIG. 11 includes a driving TFT 510, switching TFTs 511 to 515, a capacitor 520, and an organic EL element 530. The switching TFTs 511 and 514 are of an n-channel type and other TFTs are of a p-channel type.

The pixel circuit 500 is obtained by making a change to the pixel circuit 100 (FIG. 2) according to the first embodiment such that the switching TFT 112 is connected to a reference supply wiring line Vs. In the pixel circuit 500, the switching TFT 512 is provided between a connection point B and the reference supply wiring line Vs. Except for the above points, the configuration of the pixel circuit 500 is the same as that of the pixel circuit 100.

Figure 12:
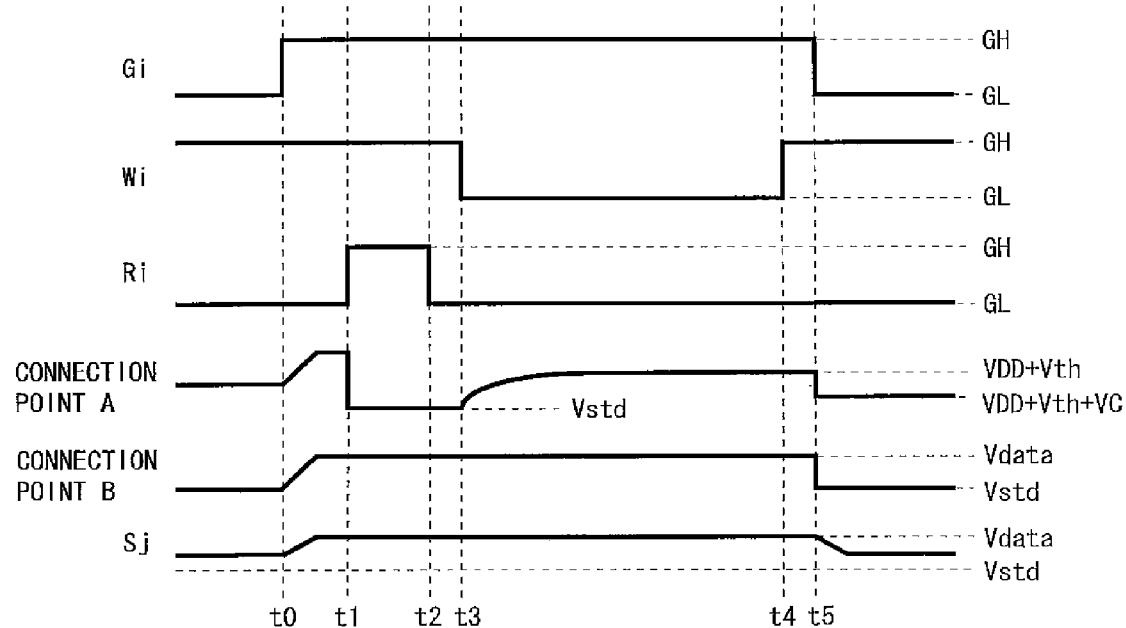
FIG. 12 is a timing chart of the pixel circuit shown in FIG. 11.

FIG. 12 is a timing chart of the pixel circuit 500. FIG. 12 shows changes in potentials applied to a scanning line Gi, control lines Wi and Ri, and a data line Sj and changes in potentials at connection points A and B. In FIG. 12, the period from time t0 to time t5 corresponds to one horizontal scanning period. With reference to FIG. 12, differences in operation between the pixel circuit 500 and the pixel circuit 100 will be described below.

As shown in FIG. 12, the pixel circuit 500 operates in the same manner as the pixel circuit 100 during the period from time t0 to time t5. When at time t5 the potential of the scanning line Gi is changed to GL, the switching TFTs 512 and 515 are changed to a conduction state and the switching TFT 511 is changed to a non-conduction state. Thus, the connection point B is disconnected from the data line Sj and connected to the reference supply wiring line Vs through the switching TFT 512. Hence, the potential at the connection point B is changed from Vdata to Vstd and accordingly the potential at the connection point A is also changed by the same amount (Vstd Vdata; hereinafter, referred to as VC) and becomes (VDD+Vth+VC).

After time t5, the switching TFT 515 is in a conduction state and thus a current flows through the organic EL element 530 from a power supply wiring line Vp through the driving TFT 510 and the switching TFT 515. Although the amount of current flowing through the driving TFT 510 increases or decreases depending on the gate terminal potential (VDD+ Vth+VC), even when the threshold voltage Vth is different, if the potential difference VC (=Vstd−Vdata) is the same, then the amount of current is the same. Therefore, regardless of the value of the threshold voltage Vth of the driving TFT 510, a current of an amount according to the potential Vdata applied to the data line Sj flows through the organic EL element 530 and thus the organic EL element 530 emits light with a specified luminance.

As described above, in the pixel circuit 500, the switching TFT 512 is provided between the connection point B and the reference supply wiring line Vs. Even with the display device according to the present embodiment including such a pixel circuit 500, the gate terminal potential of the driving TFT 510 can be kept at a level according to the data potential Vdata, and thus, the same effect as that obtained in the first embodiment can be obtained. In addition to this, according to the display device according to the present embodiment, a peak luminance adjustment for improving display quality can be easily performed, as shown below.

In order to perform a peak luminance adjustment in a conventional display device, there is a need, for example, to accumulate display data in a memory, etc., to determine a peak luminance, perform a conversion process according to the determined peak luminance on the display data, and provide a potential according to the converted display data to a pixel circuit. However, to perform these processes, there is a need to add a memory and an arithmetic circuit to a display control circuit or a source driver circuit and add a circuit that supports a peak luminance adjustment to an output portion of the source driver circuit. Therefore, adding a peak luminance adjustment function to a conventional display device greatly increases the cost and power consumption of the display device.

In contrast, in the display device according to the present embodiment, since the gate terminal potential of the driving TFT 510 is (VDD+Vth+VC) and the potentials VDD and Vth have fixed values, the luminance of the organic EL element 530 increases or decreases according to the potential difference VC (=Vstd−Vdata). Therefore, even without individually changing the data potential Vdata, by adjusting the reference potential Vstd according to the peak luminance by the reference supply adjustment circuit 14, the luminance of the organic EL element 530 can be uniformly adjusted. In this case, a circuit does not need to be added to an output portion of the source driver circuit. Thus, according to the display device according to the present embodiment, only by adding a small amount of circuit, without changing display data, a peak luminance adjustment can be easily performed.

(Sixth Embodiment)

Figure 13:
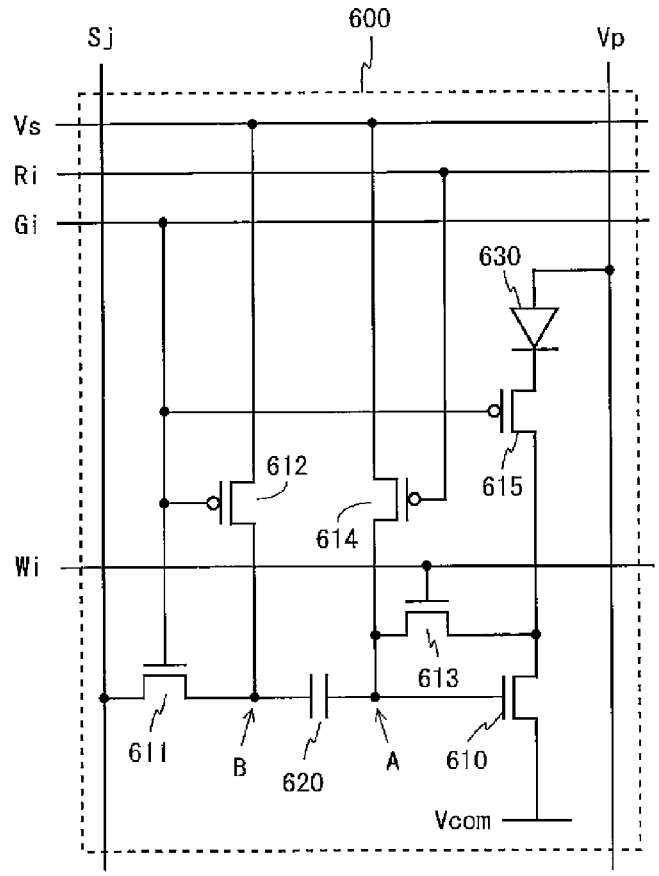
FIG. 13 is a circuit diagram of a pixel circuit included in a display device according to the sixth embodiment of the present invention.

FIG. 13 is a circuit diagram of a pixel circuit included in a display device according to the sixth embodiment of the present invention. A pixel circuit 600 shown in FIG. 13 includes a driving TFT 610, switching TFTs 611 to 615, a capacitor 620, and an organic EL element 630. The switching TFTs 612, 614, and 615 are of a p-channel type and other TFTs are of an n-channel type.

The pixel circuit 600 is obtained by making a change to the pixel circuit 500 (FIG. 11) according to the fifth embodiment such that the driving TFT 510 and the switching TFT 513 are changed to TFT of an n-channel type, the switching TFT 514 is changed to a TFT of a p-channel type, and the arrangement order of elements on a path connecting a power supply wiring line Vp to a common cathode Vcom is changed. In the pixel circuit 600, on the path connecting the power supply wiring line Vp to the common cathode Vcom, in order from the side of the power supply wiring line Vp, the organic EL element 630, the switching TFT 615, and the driving TFT 610 are provided in series. Except for the above points, the configuration of the pixel circuit 600 is the same as that of the pixel circuit 500.

Figure 14:
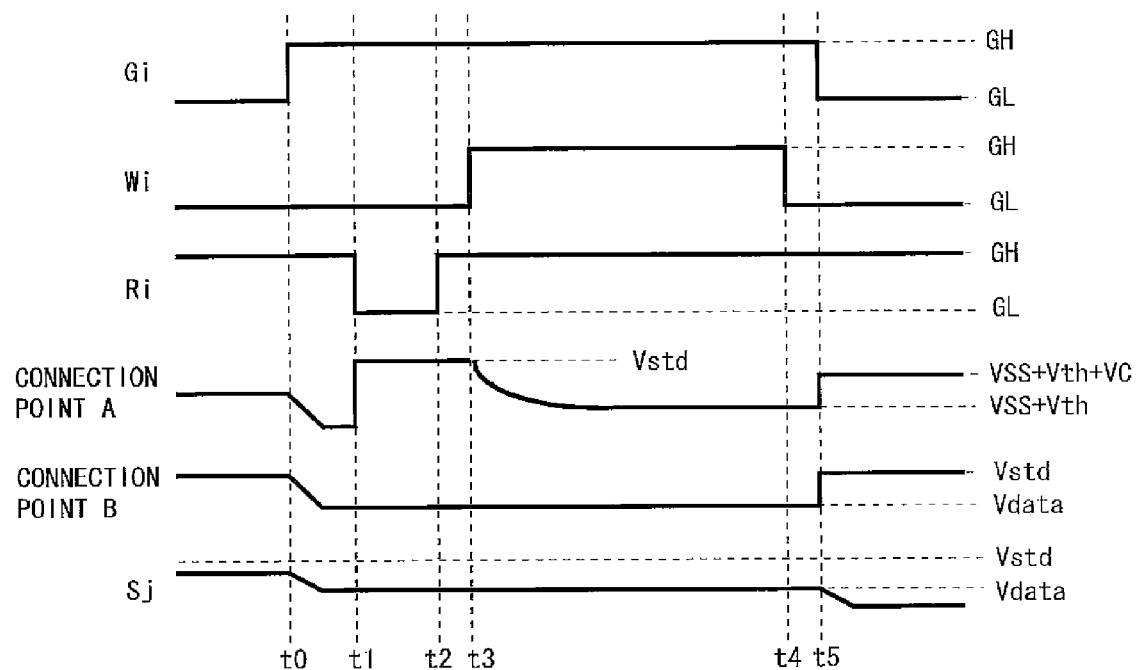
FIG. 14 is a timing chart of the pixel circuit shown in FIG. 13.

FIG. 14 is a timing chart of the pixel circuit 600. FIG. 14 shows changes in potentials applied to a scanning line Gi, control lines Wi and Ri, and a data line Sj and changes in potentials at connection points A and B. In FIG. 14, the period from time t0 to time t5 corresponds to one horizontal scanning period. With reference to FIG. 14, the operation of the pixel circuit 600 will be described below.

Before time t0, the potentials of the scanning line Gi and the control line Wi are controlled to CL, the potential of the control line Ri is controlled to GH, and the potential of the data line Sj is controlled to a level according to display data for the last time. Hence, the switching TFTs 612 and 615 are in a conduction state and the switching TFTs 611, 613, and 614 are in a non-conduction state. The potential at the connection point A is a potential according to data written to the pixel circuit 600 last time and the potential at the connection point B is Vstd.

When at time t0 the potential of the scanning line Gi is changed to GH, the switching TFT 611 is changed to a conduction state and the switching TFTs 612 and 615 are changed to a non-conduction state. Since, while the potential of the scanning line Gi is GH (during the period from time t0 to time t5), the switching TFT 615 is in a non-conduction state, a current does not flow through the organic EL element 630 and thus the organic EL element 630 does not emit light.

While the potential of the scanning line Gi is GH, the potential of the data line Sj is controlled to a data potential Vdata. During this period, the connection point B is connected to the data line Sj through the switching TFT 611 and thus the potential at the connection point B becomes Vdata. Since, during the period from time t0 to time t1, the switching TFTs 613 and 614 are in a non-conduction state, when the potential at the connection point B is changed from Vstd to Vdata, the potential at the connection point A is also changed by the same amount (Vdata−Vstd).

Then, when at time t1 the potential of the control line Ri is changed to GL, the switching TFT 614 is changed to a conduction state. Thus, the connection point A is connected to the reference supply wiring line Vs through the switching TFT 614 and thus the potential at the connection point A is changed to Vstd. At this time, since the connection point B is connected to the data line Sj through the switching TFT 611, even when the potential at the connection point A is changed, the potential at the connection point B remains at Vdata.

The reference potential Vstd of the reference supply wiring line Vs is determined such that the driving TFT 610 goes into a conduction state when the reference potential Vstd is applied to the gate terminal. Hence, after time t1, the driving TFT 610 is surely in a conduction state. Note that even when the driving TFT 610 goes into a conduction state, while the switching TFT 615 is in a non-conduction state, a current does not flow through the organic EL element 630 and thus the organic EL element 630 does not emit light.

Then, when at time t2 the potential of the control line Ri is changed to GH, the switching TFT 614 is changed to a non-conduction state. Thus, the connection point A is disconnected from the reference supply wiring line Vs and thus the potential at the connection point A is fixed. At this time, a potential difference (Vstd−Vdata) between the connection points A and B is held in the capacitor 620.

Then, when at time t3 the potential of the control line Wi is changed to GH, the switching TFT 613 is changed to a conduction state. Thus, the gate and drain terminals of the driving TFT 610 are short circuited, whereby the driving TFT 610 forms a diode connection. During the period from time t1 to time t2, the reference potential Vstd is applied to the connection point A and after time t2 too, the potential at the connection point A is kept at Vstd by the capacitor 620. Therefore, after time t3 too, the driving TFT 610 is surely in a conduction state.

Also, a current flows out to the common cathode Vcom from the connection point A through the switching TFT 613 and the driving TFT 610 and thus the potential at the connection point A (the gate terminal potential of the driving TFT 610) drops while the driving TFT 610 is in a conduction state. The driving TFT 610 is changed to a non-conduction state when the gate-source voltage becomes a threshold voltage Vth (positive value) (i.e., the potential at the connection point A becomes (VSS+Vth)). Hence, the potential at the connection point A drops to (VSS+Vth) and the driving TFT 610 goes into a threshold state.

Then, when at time t4 the potential of the control line Wi is changed to GL, the switching TFT 613 is changed to a non-conduction state. At this time, a potential difference (VSS+Vth–Vdata) between the connection points A and B is held in the capacitor 620.

Then, when at time t5 the potential of the scanning line Gi is changed to GL, the switching TFTs 612 and 615 are changed to a conduction state and the switching TFT 611 is changed to a non-conduction state. Thus, the connection point B is disconnected from the data line Sj and connected to a reference supply wiring line Vs through the switching TFT 612. Hence, the potential at the connection point B is changed from Vdata to Vstd and accordingly the potential at the connection point A is also changed by the same amount (Vstd Vdata; hereinafter, referred to as VC) and becomes (VSS+Vth+VC).

After time t5, the switching TFT 615 is in a conduction state and thus the current flowing through the common cathode Vcom from the power supply wiring line Vp through the switching TFT 615 and the driving TFT 610 also flows through the organic EL element 630. Although the amount of current flowing through the driving TFT 610 increases or decreases depending on the gate terminal potential (VSS+Vth+VC), even when the threshold voltage Vth is different, if the potential difference VC (=Vstd Vdata) is the same, then the amount of current is the same. Therefore, regardless of the value of the threshold voltage Vth of the driving TFT 610, a current of an amount according to the potential Vdata applied to the data line Sj flows through the organic EL element 630 and thus the organic EL element 630 emits light with a specified luminance.

As described above, the pixel circuit 600 includes the driving TFT 610 of an n-channel type. Even with the display device according to the present embodiment including such a pixel circuit 600, as with the fifth embodiment, the same effect as that obtained in the first embodiment and the effect of being able to easily perform a peak luminance adjustment can be obtained.

(Seventh Embodiment)

Figure 15:
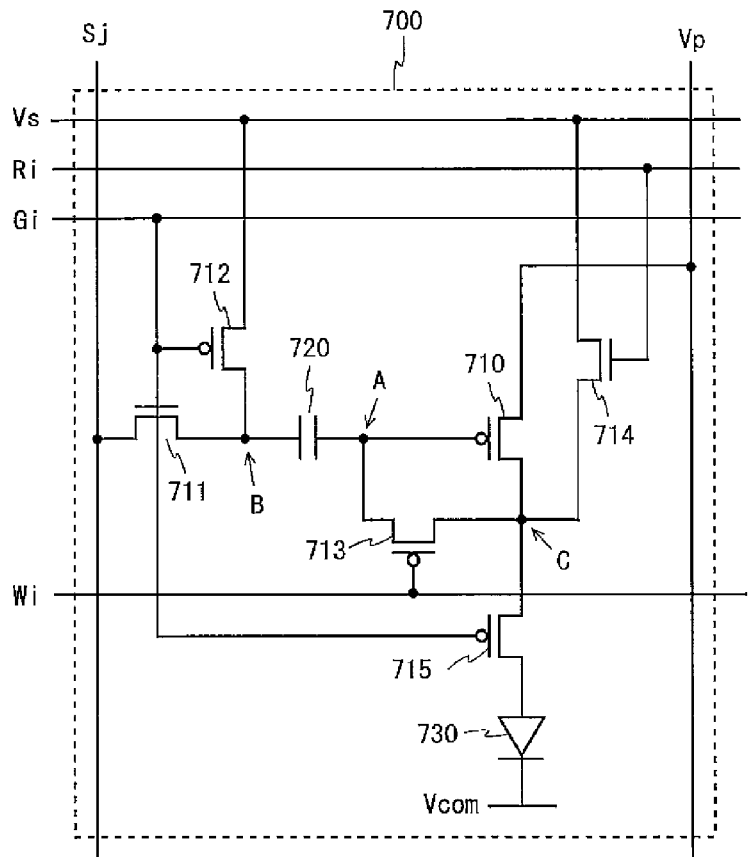
FIG. 15 is a circuit diagram of a pixel circuit included in a display device according to the seventh embodiment of the present invention.

FIG. 15 is a circuit diagram of a pixel circuit included in a display device according to the seventh embodiment of the present invention. A pixel circuit 700 shown in FIG. 15 includes a driving TFT 710, switching TFTs 711 to 715, a capacitor 720, and an organic EL element 730. The switching TFTs 711 and 714 are of an n-channel type and other TFTs are of a p channel type.

The pixel circuit 700 is obtained by making a change to the pixel circuit 500 (FIG. 11) according to the fifth embodiment such that the switching TFT 514 is connected to a different point. In FIG. 15, a connection point between the driving TFT 710 and the switching TFTs 713 and 715 is referred to as C. In the pixel circuit 700, the switching TFT 714 is provided between the connection point C and a reference supply wiring line Vs. Except for the above points, the configuration of the pixel circuit 700 is the same as that of the pixel circuit 500.

Figure 16:
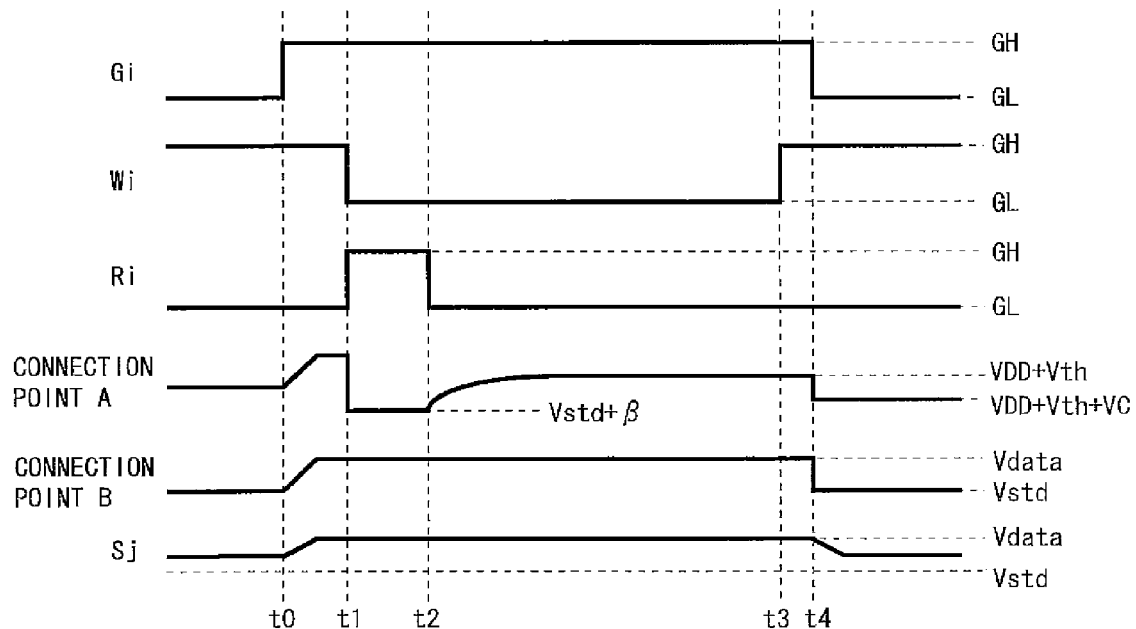
FIG. 16 is a timing chart of the pixel circuit shown in FIG. 15.
Figure 17:
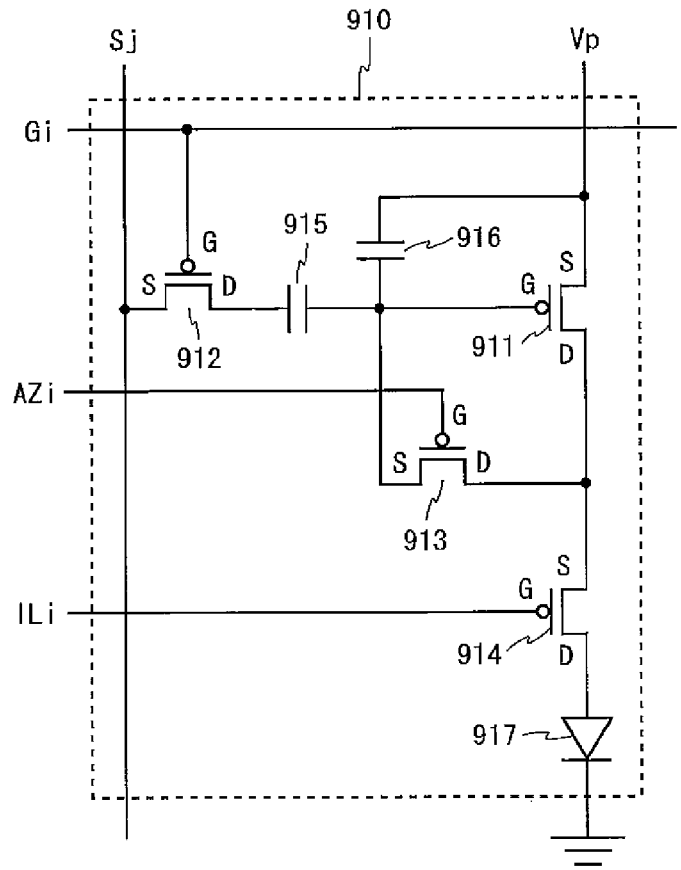
FIG. 17 is a circuit diagram of a pixel circuit (first example) included in a conventional display device.
Figure 18:
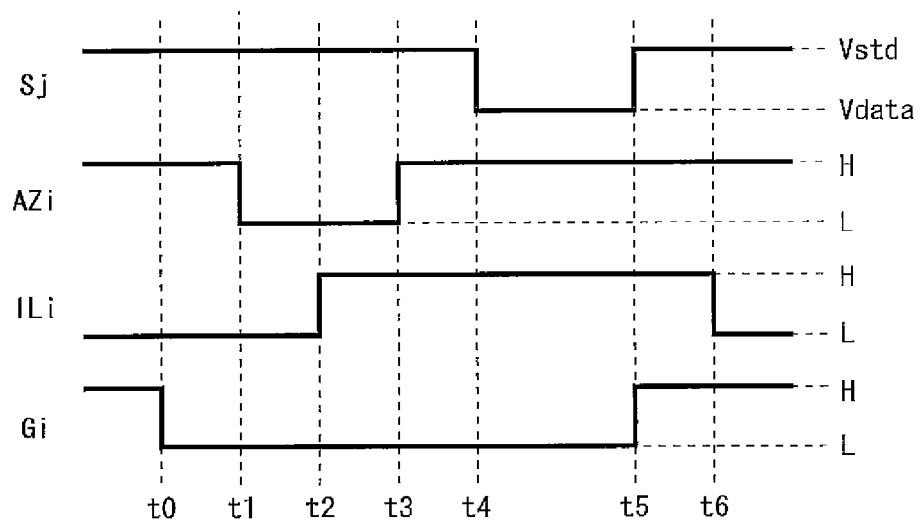
FIG. 18 is a timing chart of the pixel circuit shown in FIG. 17.
Figure 19:
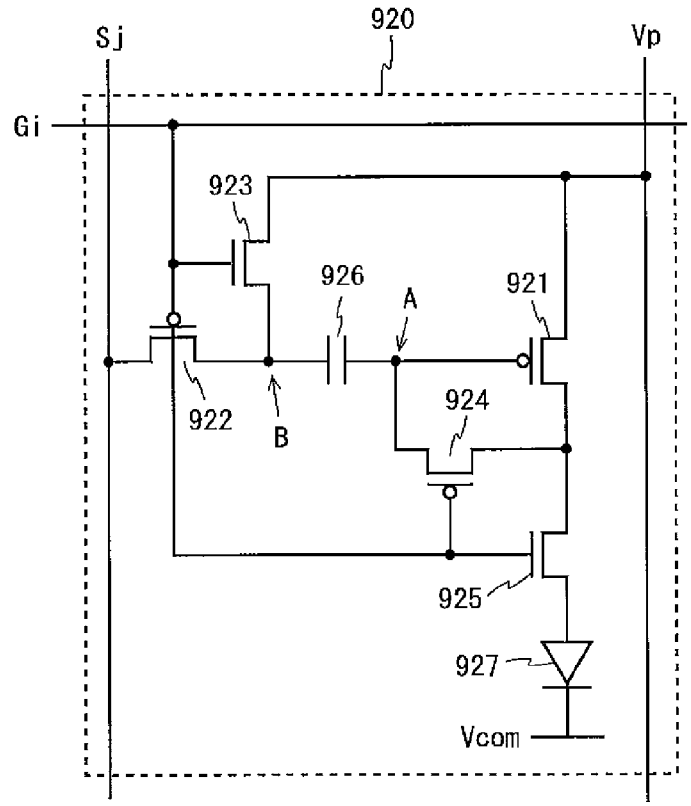
FIG. 19 is a circuit diagram of a pixel circuit (second example) included in a conventional display device.
Figure 20:
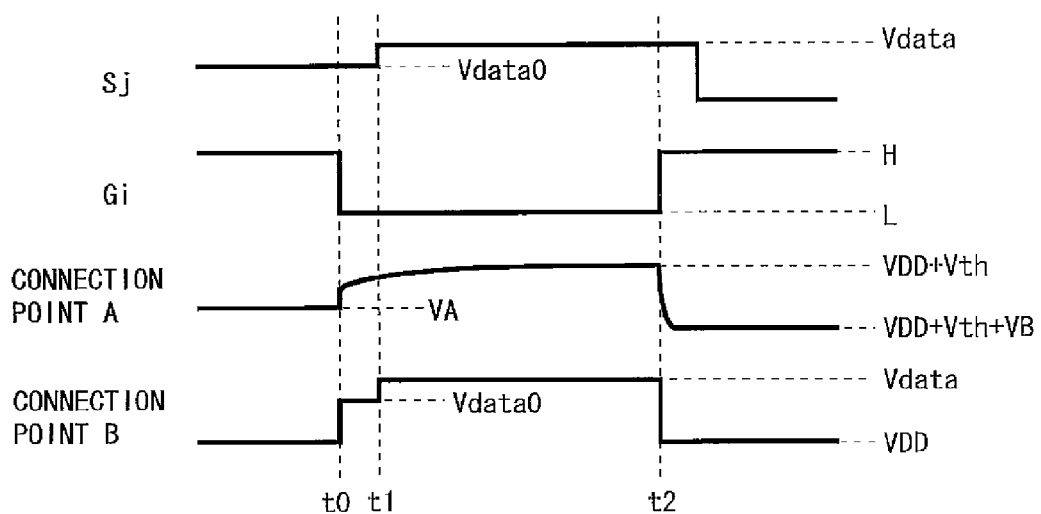
FIG. 20 is a timing chart of the pixel circuit shown in FIG. 19.
Figure 21:
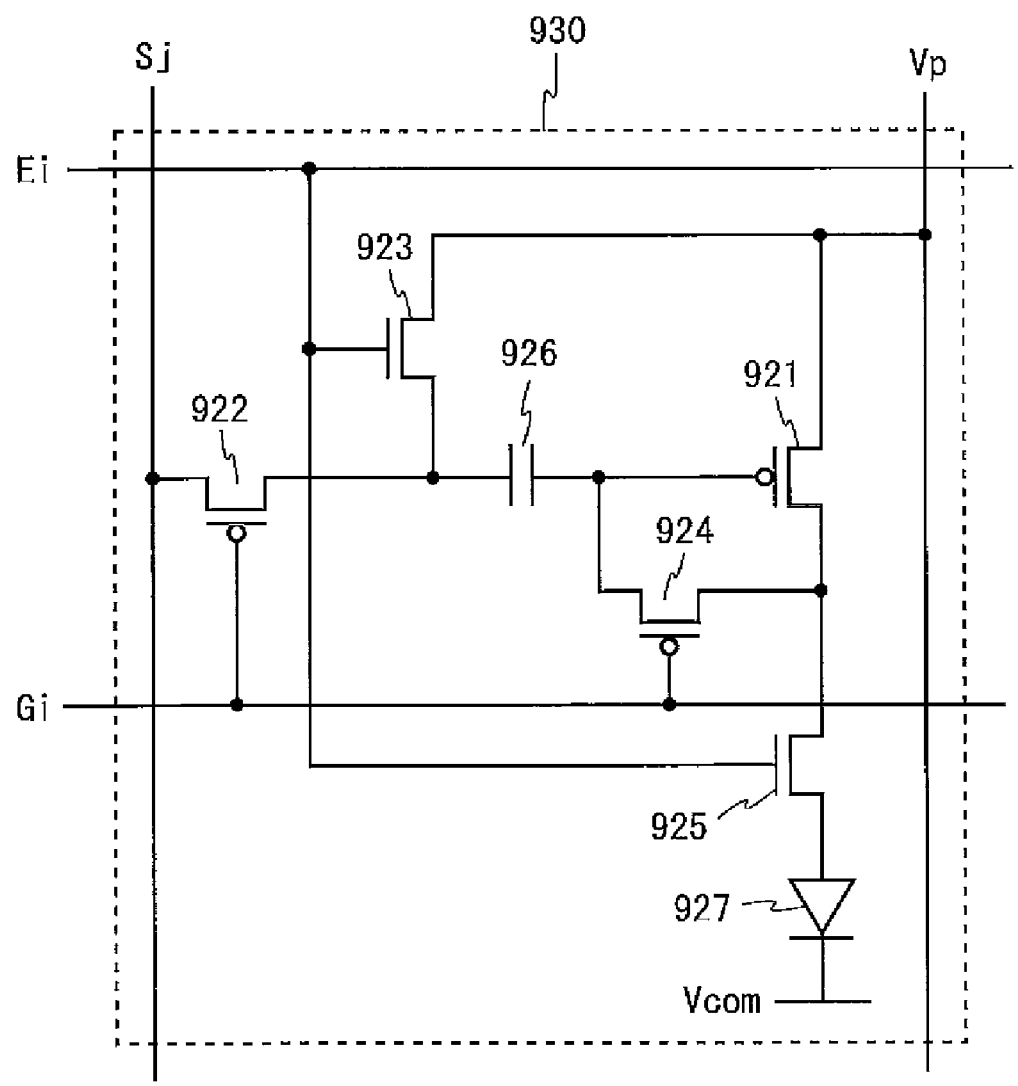
FIG. 21 is a circuit diagram of a pixel circuit (third example) included in a conventional display device.

FIG. 16 is a timing chart of the pixel circuit 700. FIG. 16 shows changes in potentials applied to a scanning line Gi, control lines Wi and Ri, and a data line Sj and changes in potentials at connection points A and B. In FIG. 16, the period from time t0 to time t4 corresponds to one horizontal scanning period. With reference to FIG. 16, differences in operation between the pixel circuit 700 and the pixel circuit 500 will be described below.

The pixel circuit 700 operates in the same manner as the pixel circuit 500 (i.e., in the same manner as the pixel circuit 100) during the period from time t0 to time t1. When at time t1 the potential of the control line Wi is changed to GL and the potential of the control line Ri is changed to GH, the switching TFTs 713 and 714 are changed to a conduction state. Thus, the connection point A is connected to the reference supply wiring line Vs through the switching TFTs 713 and 714 and thus the potential at the connection point A is changed to Vstd.

The reference potential Vstd of the reference supply wiring line Vs is determined such that the driving TFT 710 goes into a conduction state when the reference potential Vstd is applied to the gate terminal. Hence, after time t1, the driving TFT 710 is surely in a conduction state. Note that even when the driving TFT 710 goes into a conduction state, while the switching TFT 715 is in a non-conduction state, a current does not flow through the organic EL element 730 and thus the organic EL element 730 does not emit light.

Meanwhile, when the switching TFT 713 goes into a conduction state, the gate and drain terminals of the driving TFT 710 are short-circuited, whereby the driving TFT 710 forms a diode connection. Hence, a current flows into the connection point A from the power supply wiring line Vp through the driving TFT 710 and the switching TFT 713 and thus the potential at the connection point A rises by an amount corresponding to the current flown into. Accordingly, the potential at the connection point A becomes, strictly speaking, a potential (Vstd+β) which is a little higher than Vstd.

Then, when at time t2 the potential of the control line Ri is changed to GL, the switching TFT 714 is changed to a non-conduction state. Thus, the current flowing into the connection point A from the reference supply wiring line Vs through the switching TFT 714 is interrupted. Instead of this, a current flows into the connection point A from the power supply wiring line Vp through the driving TFT 710 and the switching TFT 713, and the potential at the connection point A (the gate terminal potential of the driving TFT 710) rises while the driving TFT 710 is in a conduction state. The driving TFT 710 is changed to a non-conduction state when the gate-source voltage becomes a threshold voltage Vth (negative value) (i.e., the potential at the connection point A becomes (VDD+Vth)). Thus, the potential at the connection point A rises to (VDD+Vth) and the driving TFT 710 goes into a threshold state.

After time t3, the pixel circuit 700 operates in the same manner as the pixel circuit 500 does after time t4. After time t4, regardless of the value of the threshold voltage Vth of the driving TFT 710, a current of an amount according to the data potential Vdata flows through the organic EL element 730 and thus the organic EL element 730 emits light with a specified luminance.

As described above, in the pixel circuit 700, the switching TFT 714 is connected to the reference supply wiring line Vs and the drain terminal of the driving TFT 710 (a current input/output terminal connected to the switching TFT 713). Even with the display device according to the present embodiment including such a pixel circuit 700, as with the fifth embodiment, the same effect as that obtained in the first embodiment and the effect of being able to easily perform a peak luminance adjustment can be obtained.

Generally, in a pixel circuit, since a leakage current flows through a switching element, a charge held in a capacitor increases or decreases while an electro-optical element emits light and thus there is a problem that the luminance of the electro-optical element varies with elapsed time. Here, the number of switching TFTs connected to the connection point A is one in the pixel circuit 700 while two in the pixel circuit 500. As such, since in the pixel circuit 700 the number of switching TFTs connected to the gate terminal of the driving TFT 710 is smaller, a leakage current is also little and a charge held in the capacitor 720 is also less likely to fluctuate. Hence, according to the display device according to the present embodiment, fluctuations in the gate terminal potential of the driving TFT 710 can be suppressed and display quality can be enhanced.

Note that although the pixel circuit 700 is obtained by making a change to the pixel circuit 500 according to the fifth embodiment such that one terminal of a switching TFT is connected to the reference supply wiring line Vs, and the other terminal is connected to a drain terminal of a driving TFT, the same change may be made to the pixel circuits according to the first to fourth and sixth embodiments. Even with a display device including a pixel circuit to which a change has been made, as with the seventh embodiment, fluctuations in the gate terminal potential of a driving TFT can be suppressed and display quality can be enhanced.

As described above, according to the display devices according to the embodiments, variations in the threshold voltage of a driving TFT can be properly compensated for, unwanted light emission from an organic EL element can be prevented, the contrast of a display screen can be enhanced, and the lifetime of the organic EL element can be extended. The present invention is not limited to the embodiments and the features of the embodiments can be appropriately combined.

Industrial Applicability

A display device of the present invention obtains the effect of being able to properly compensate for variations in the threshold voltage of a drive element and to prevent unwanted light emission from an electro-optical element, and thus, can be used in various display devices including electric current driving type display elements, such as an organic EL display and an FED.

The invention claimed is:

1. An electric current driving type display device comprising:
a plurality of pixel circuits arranged so as to correspond to respective intersections of a plurality of scanning lines and a plurality of data lines;
a scanning signal output circuit that selects a write-target pixel circuit using the scanning line; and
a display signal output circuit that provides potentials according to display data to the data lines, wherein
each of the pixel circuits includes:
an electro-optical element provided between a first power supply wiring line and a second power supply wiring line;
a drive element provided in series with the electro-optical element and between the first power supply wiring line and the second power supply wiring line;
a capacitor having a first electrode connected to a control terminal of the drive element;
a first switching element provided between a second electrode of the capacitor and the data line;
a second switching element provided between the second electrode of the capacitor and a predetermined power supply wiring line;
a third switching element provided between the control terminal and one current input/output terminal of the drive element; and
a fourth switching element having a source terminal directly connected to a third power supply wiring line and having a drain terminal directly connected to the control terminal of the drive element, and wherein
a potential that brings the drive element into a conduction state is applied to the third power supply wiring line.

2. The display device according to claim 1, wherein
when writing to the pixel circuit,
during a first period, the first and fourth switching elements are controlled to a conduction state and the second and third switching elements are controlled to a non-conduction state,
then, during a second period, the fourth switching element is controlled to a non-conduction state and the third switching element is controlled to a conduction state, and
then, during a third period, the first and third switching elements are controlled to a non-conduction state and the second switching element is controlled to a conduction state.

3. The display device according to claim 1, wherein the second switching element is provided between the first power supply wiring line and the second electrode of the capacitor.

4. The display device according to claim 3, wherein
a control terminal of the fourth switching element is connected to the third power supply wiring line, and
a potential of the third power supply wiring line is switched between a potential that brings the drive element into a conduction state and a potential that brings the fourth switching element into a non-conduction state.

5. The display device according to claim 1, wherein the second switching element is provided between the third power supply wiring line and the second electrode of the capacitor.

6. The display device according to claim 5, wherein a potential of the third power supply wiring line is configured to be controllable.

7. The display device according to claim 1, wherein each of the pixel circuits further includes a fifth switching element provided between the drive element and the electro-optical element.

8. The display device according to claim 1, wherein when writing to the pixel circuit, a potential of the second power supply wiring line is controlled such that an applied voltage to the electro-optical element is lower than a light-emission threshold voltage.

9. The display device according to claim 1, wherein the electro-optical element includes an organic EL element.

10. The display device according to claim 1, wherein the drive element and all of the switching elements in the pixel circuit include thin-film transistors.

11. The display device according to claim 10, wherein the drive element and all of the switching elements in the pixel circuit include thin-film transistors of a same channel type.

* * * * *